United States Patent
Ryoki et al.

(10) Patent No.: US 8,368,785 B2
(45) Date of Patent: Feb. 5, 2013

(54) IMAGE SENSING DEVICE AND IMAGING SYSTEM

(75) Inventors: Tatsuya Ryoki, Kawasaki (JP); Toru Koizumi, Yokohama (JP); Masanori Ogura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 389 days.

(21) Appl. No.: 12/812,595

(22) PCT Filed: Mar. 9, 2009

(86) PCT No.: PCT/JP2009/054969
§ 371 (c)(1),
(2), (4) Date: Jul. 12, 2010

(87) PCT Pub. No.: WO2009/113695
PCT Pub. Date: Sep. 17, 2009

(65) Prior Publication Data
US 2010/0289933 A1    Nov. 18, 2010

(30) Foreign Application Priority Data
Mar. 14, 2008    (JP) .................................. 2008-066736

(51) Int. Cl.
H04N 3/14    (2006.01)
H04N 5/335    (2011.01)
H04N 5/225    (2006.01)
H01L 31/062    (2012.01)
H01L 31/113    (2006.01)

(52) U.S. Cl. ......... 348/294; 348/372; 257/291; 257/292
(58) Field of Classification Search .......... 348/294–324, 348/372; 250/200, 206, 208.1; 257/207, 257/414, 428–466, 290–294; 341/126–172
See application file for complete search history.

(56) References Cited

U.S. PATENT DOCUMENTS

| | | | |
|---|---|---|---|
| 5,537,075 A | 7/1996 | Miyazaki | 327/566 |
| 6,538,245 B1* | 3/2003 | Kozlowski | 250/208.1 |
| 6,567,571 B1 | 5/2003 | Kochi et al. | 382/312 |
| 6,784,928 B1 | 8/2004 | Sakurai et al. | 348/220.1 |
| 6,798,453 B1 | 9/2004 | Kaifu | 348/304 |
| 6,963,372 B1 | 11/2005 | Hiyama et al. | 348/302 |
| 7,015,844 B1* | 3/2006 | Boemler | 341/143 |

(Continued)

FOREIGN PATENT DOCUMENTS

| | | |
|---|---|---|
| EP | 926886 | 6/1999 |
| JP | 5-095099 | 4/1993 |

(Continued)

*Primary Examiner* — Aung S Moe
*Assistant Examiner* — Chia-Wei A Chen
(74) *Attorney, Agent, or Firm* — Fitzpatrick, Cella, Harper & Scinto

(57) ABSTRACT

An image sensing device characterized by including: a pixel array; a plurality of first holding capacitances; a plurality of second holding capacitances; a first reference power supply pattern; and a second reference power supply pattern, wherein at least part of the first reference power supply pattern is arranged in a first region where reference power supply electrodes of the plurality of first holding capacitances are arrayed, at least part of the second reference power supply pattern is arranged in a second region where reference power supply electrodes of the plurality of second holding capacitances are arrayed, and the first reference power supply pattern and the second reference power supply pattern are isolated in a region including the first region and the second region.

14 Claims, 21 Drawing Sheets

U.S. PATENT DOCUMENTS

| | | | |
|---|---|---|---|
| 7,081,607 B1 | 7/2006 | Koizumi | 250/208.1 |
| 7,956,916 B2 * | 6/2011 | Murata et al. | 348/308 |
| 7,999,875 B2 * | 8/2011 | Toya et al. | 348/360 |
| 8,164,666 B2 * | 4/2012 | Eshel et al. | 348/308 |
| 2003/0146994 A1 * | 8/2003 | Kokubun | 348/308 |
| 2004/0085465 A1 | 5/2004 | Inui et al. | 348/241 |
| 2005/0052554 A1 | 3/2005 | Sakurai et al. | 348/301 |
| 2006/0044170 A1 * | 3/2006 | Boemler | 341/155 |
| 2008/0252764 A1 * | 10/2008 | Shinohara | 348/308 |
| 2010/0141500 A1 * | 6/2010 | Kawaguchi et al. | 341/172 |
| 2011/0115761 A1 * | 5/2011 | Takei et al. | 345/204 |
| 2011/0205398 A1 * | 8/2011 | Hatano | 348/231.99 |
| 2012/0092540 A1 * | 4/2012 | Shinohara | 348/308 |

FOREIGN PATENT DOCUMENTS

| | | |
|---|---|---|
| JP | 7-176689 | 7/1995 |
| JP | 09-246517 | 9/1997 |
| JP | 11-150255 | 6/1999 |
| JP | 11-191891 | 7/1999 |
| JP | 2001-045375 | 2/2001 |
| JP | 2001-045378 | 2/2001 |
| JP | 2002-151672 | 5/2002 |
| JP | 2004-153682 | 5/2004 |
| JP | 2005-079942 | 3/2005 |

* cited by examiner

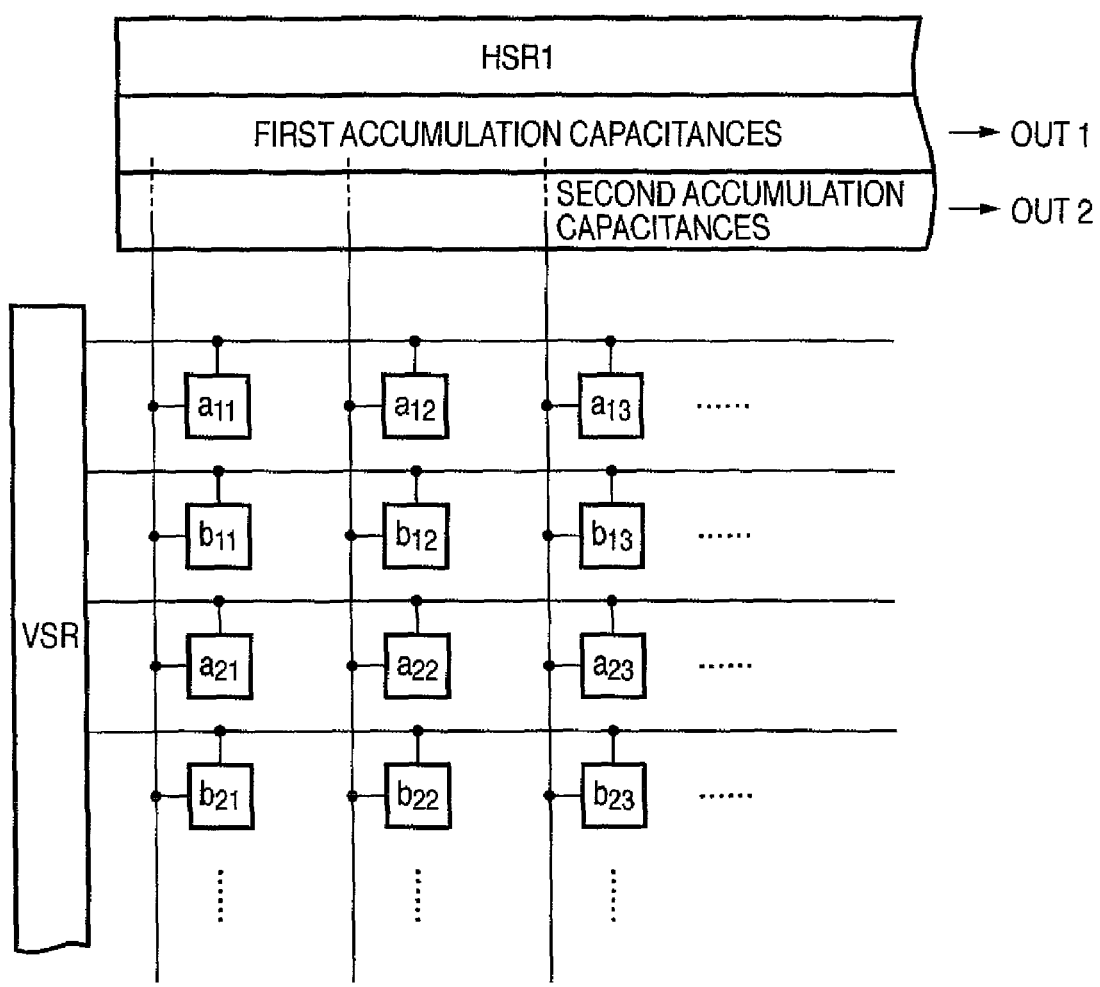
F I G. 22

IMAGE SENSING DEVICE AND IMAGING SYSTEM

TECHNICAL FIELD

The present invention relates to an image sensing device and imaging system.

BACKGROUND ART

According to a technique disclosed in Japanese Patent Laid-Open No. 2001-45378, in a pixel array in which a plurality of pixels is arrayed in a direction along the row (to be referred to as a row direction hereinafter) and a direction along the column (to be referred to as a column direction hereinafter), driving signals are supplied to respective pixels via a plurality of row control lines extending in the row direction, and signals are read out from respective pixels via a plurality of column signal lines extending in the column direction. Accumulation capacitances are connected to one end and the other end of each column signal line, respectively. When a signal is read out from either one of the two accumulation capacitances, a signal output from a pixel is accumulated in the other accumulation capacitance (see FIG. 21). Alternatively, two accumulation capacitances are parallel-connected to one end of each column signal line. When a signal is read out from either one of the two accumulation capacitances, a signal output from a pixel is accumulated in the other accumulation capacitance (see FIG. 22). According to Japanese Patent Laid-Open No. 2001-45378, the blanking period (during which no sensor output is obtained) is shortened to thereby shorten the total readout period.

According to a technique disclosed in Japanese Patent Laid-Open No. 11-150255, two accumulation capacitances and two amplifiers are alternately connected to respective column signal lines. A signal accumulated in one of the two accumulation capacitances is amplified by one of the two amplifiers, and the amplified signal is accumulated in the other accumulation capacitance. The signal accumulated in the other accumulation capacitance is amplified by the other amplifier, and read out to a subsequent output line.

The techniques disclosed in Japanese Patent Laid-Open Nos. 2001-45378 and 11-150255 do not mention in detail reference power supply electrodes in two accumulation capacitances. For example, these techniques do not describe a reference power supply pattern (ground pattern) for applying a reference power supply voltage (ground voltage).

On the contrary, the present inventor has made studies to find out the following new problem. Assume that a reference power supply voltage is applied to the reference power supply electrodes (ground electrodes) of two accumulation capacitances (holding capacitances) in accordance with one reference power supply pattern. When a signal is transferred from a pixel to one of the two accumulation capacitances, the potential of the reference power supply electrode of the accumulation capacitance may fluctuate. The fluctuations of the potential may be transferred to the reference power supply electrode of the other accumulation capacitance via one reference power supply pattern. If the potential of the reference power supply electrode of the other accumulation capacitance fluctuates, the fluctuations may be mixed as noise in a signal read out from the other accumulation capacitance.

DISCLOSURE OF INVENTION

It is an aim of the present invention to suppress fluctuations of the potential of the reference power supply electrode of one holding capacitance when a signal is transferred from a pixel to the other one of two holding capacitances for holding signals transferred at different timings via a signal line.

According to the first aspect of the present invention, there is provided an image sensing device characterized by comprising: a pixel array in which a plurality of pixels are two-dimensionally arrayed and output signals to a plurality of signal lines; a plurality of first holding capacitances which hold a first signals transferred via the plurality of signal lines; a plurality of second holding capacitances which hold a second signals transferred at different timing from the first signals via the plurality of signal lines; a first reference power supply pattern for the plurality of first holding capacitances; and a second reference power supply pattern for the plurality of second holding capacitances, wherein at least part of the first reference power supply pattern is arranged in a first region where reference power supply electrodes of the plurality of first holding capacitances are arrayed, at least part of the second reference power supply pattern is arranged in a second region where reference power supply electrodes of the plurality of second holding capacitances are arrayed, and the first reference power supply pattern and the second reference power supply pattern are isolated at least between the first region and the second region in a region including the first region and the second region).

According to the second aspect of the present invention, there is provided an imaging system characterized by comprising: an image sensing device according to the first aspect of the present invention; an optical system which forms an image on an image sensing surface of the image sensing device; and a signal processing unit which processes a signal output from the image sensing device to generate image data.

According to the present invention, it is possible to suppress fluctuations of the potential of the reference power supply electrode of one holding capacitance when a signal is transferred from a pixel to the other one of two holding capacitances for holding signals transferred at different timings via a signal line.

Further features of the present invention will become apparent from the following description of exemplary embodiments with reference to the attached drawings.

BRIEF DESCRIPTION OF DRAWINGS

FIG. 22 is a diagram for explaining a conventional technique.

BEST MODE FOR CARRYING OUT THE INVENTION

Figure 1:
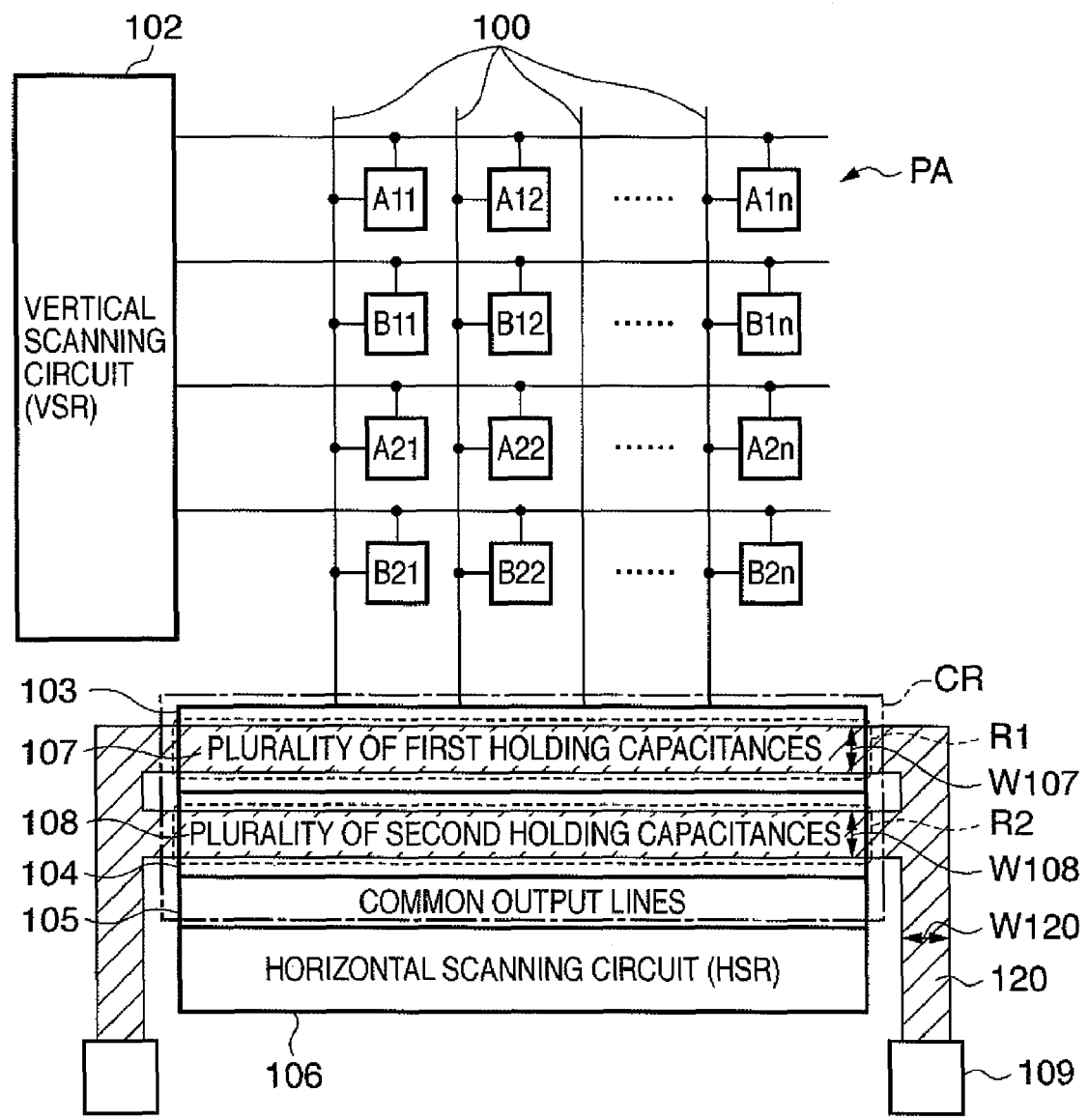
FIG. 1 is a diagram showing the schematic arrangement of an image sensing device 1 according to the first embodiment of the present invention.

The arrangement of an image sensing device 1 according to the first embodiment of the present invention will be explained with reference to FIG. 1. FIG. 1 is a diagram showing the schematic arrangement of the image sensing device 1 according to the first embodiment of the present invention.

The image sensing device 1 includes a pixel array PA, a vertical scanning circuit (VSR) 102, a plurality of first holding capacitances 103, a plurality of second holding capacitances 104, a horizontal scanning circuit (HSR) 106, a first reference power supply pattern 107, a second reference power supply pattern 108, and a common reference power supply pattern 120.

In the pixel array PA, a plurality of pixels A11 to B2$n$ are arrayed two-dimensionally. For example, a plurality of pixels A11 to B2$n$ are arrayed in the row and column directions. The row direction is defined as a direction along a row or defined as a direction across the signal line 100. The column direction is defined as a direction along a column or defined as a direction along the signal line 100. Each of the pixels A11 to B2$n$ includes a photoelectric conversion unit PD, transfer unit M1, charge-voltage converter FD, and output unit M2 (see FIG. 3). The photoelectric conversion unit PD accumulates charges generated in accordance with incident light. The photoelectric conversion unit PD is, for example, a photodiode. Upon receiving an active-level transfer signal ɸTX from the vertical scanning circuit 102, the transfer unit M1 transfers charges generated in the photoelectric conversion unit PD to the charge-voltage converter FD. The transfer unit M1 is, for example, a transfer MOS transistor. The charge-voltage converter FD converts transferred charges into a voltage, and inputs the converted voltage to the output unit M2. The charge-voltage converter FD is, for example, a floating diffusion. The output unit M2 outputs a signal corresponding to the input voltage to a column signal line 100. The output unit M2 is, for example, an amplification MOS transistor which forms a source follower circuit together with a constant current source CS connected to the column signal line 100. A plurality of column signal lines 100 extend in the column direction, and transfer signals output from pixels in respective columns.

The vertical scanning circuit 102 scans the pixel array PA in the vertical direction (column direction) to drive the pixels A11 to B2$n$ so as to output signals to the column signal lines 100.

The plurality of first holding capacitances 103 are connected to pixels in a plurality of columns via the plurality of column signal lines 100. The plurality of first holding capacitances 103 hold signals transferred via the plurality of column signal lines 100. Each first holding capacitance includes a signal electrode (first electrode) for receiving a signal, and a reference power supply electrode for receiving a reference power, which will be described later. In each first holding capacitance, the signal electrode and reference power supply electrode are arranged to form a capacitance. For example, the signal electrode and reference power supply electrode are arranged to face each other. The first holding capacitances 103 are arranged in a first region R1.

The plurality of second holding capacitances 104 are connected to pixels in a plurality of columns via the plurality of column signal lines 100. The plurality of second holding capacitances 104 hold other signals transferred via the plurality of column signal lines 100. Each second holding capacitance includes a signal electrode (second electrode) for receiving a signal, and a reference power supply electrode for receiving a reference power, which will be described later. In each second holding capacitance, the signal electrode and reference power supply electrode are arranged to form a capacitance. For example, the signal electrode and reference power supply electrode are arranged to face each other. The second holding capacitances 104 are arranged in a second region R2.

The horizontal scanning circuit 106 scans the plurality of first holding capacitances 103 and the plurality of second holding capacitances 104 in the horizontal direction (row direction). Signals held in the plurality of first holding capacitances and other signals held in the plurality of second holding capacitances are sequentially read out to common output lines 105.

The first reference power supply pattern 107 is a pattern for the plurality of first holding capacitances, and part of it is arranged in the first region R1. The first reference power supply pattern 107 is electrically connected to the reference power supply electrode of each first holding capacitance. The first reference power supply pattern is a pattern which is obtained by patterning a conductor. The first reference power supply pattern is, for example, a metal wiring.

The second reference power supply pattern 108 is a pattern for the plurality of second holding capacitances, and part of it is arranged in the second region R2. The second reference power supply pattern 108 is electrically connected to the reference power supply electrode of each second holding capacitance. The second reference power supply pattern is a pattern which is obtained by patterning a conductor. The second reference power supply pattern is, for example, a metal wiring.

The common reference power supply pattern 120 electrically connects the first reference power supply pattern 107 and second reference power supply pattern 108 outside a region CR. The region CR includes the first region R1 and second region R2. The common reference power supply pattern 120 is electrically connected to reference power supply pads 109. A width W120 of the common reference power supply pattern 120 is larger than a width W107 of the first reference power supply pattern 107 and a width W108 of the second reference power supply pattern 108. Thus, the wiring resistance of the common reference power supply pattern 120 is lower than that of the first reference power supply pattern 107 and that of the second reference power supply pattern 108.

The first reference power supply pattern 107 and second reference power supply pattern 108 are isolated between at least the first region R1 and the second region R2 in the region CR including the first region R1 and second region R2. Even if the potential of the reference power supply electrode of the first holding capacitance fluctuates when transferring a signal from a pixel to the first holding capacitance, the fluctuations of the potential are hardly directly transferred from the first reference power supply pattern 107 to the second reference power supply pattern 108. Hence, the potential of the reference power supply electrode of the second holding capacitance hardly fluctuates. That is, when transferring a signal from a pixel to one of two holding capacitances for holding signals transferred at different timings via a column signal line, fluctuations of the potential of the reference power supply electrode of the other holding capacitance can be suppressed.

When the potential of the reference power supply electrode of the first holding capacitance fluctuates, the fluctuations of the potential are transferred from the first reference power supply pattern 107 to the common reference power supply pattern 120. At this timing the wiring resistance of the common reference power supply pattern 120 is lower than that of the second reference power supply pattern 108. Thus, the fluctuations of the potential can be easily transferred via the common reference power supply pattern 120 and the reference power supply pad 109 to the outside of the image sensing device 1. Also in this respect, fluctuations of the potential of the reference power supply electrode of the first holding capacitance are hardly transferred to the reference power supply electrode of the second holding capacitance.

It should be noted that "the first reference power supply pattern 107 and second reference power supply pattern 108 are isolated" means that the both reference power supply patterns 107, 108 are electrically isolated by an insulator. For instance, in FIG. 1, an insulator arranged between the first reference power supply pattern 107 and second reference power supply pattern 108 to isolate the both reference power supply patterns 107, 108. The insulator includes, for example, a silicon oxide or a silicon nitride as a main component.

Figure 2:
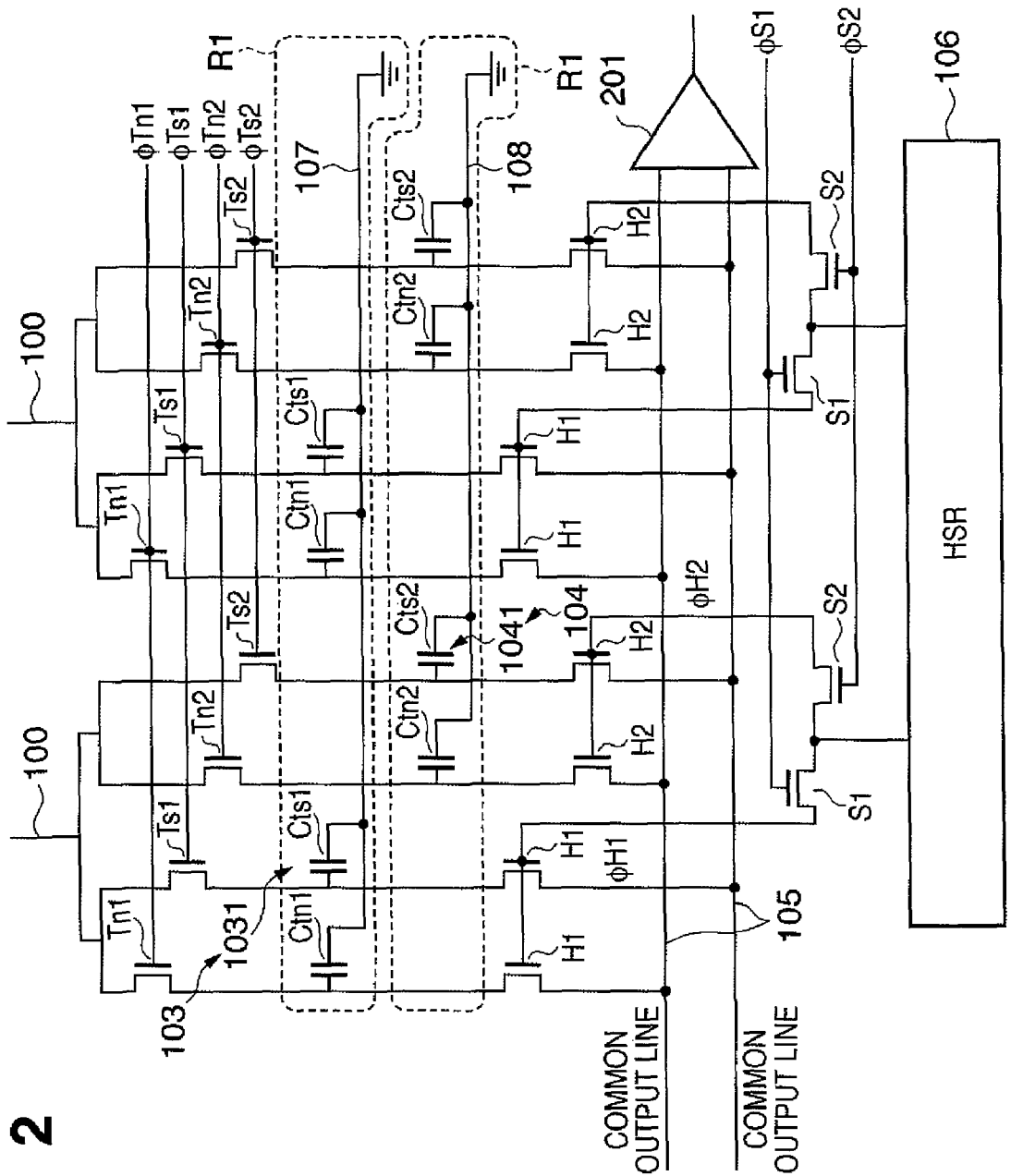
FIG. 2 is a circuit diagram showing an example of the circuit arrangement of the image sensing device 1 according to the first embodiment of the present invention.
Figure 3:
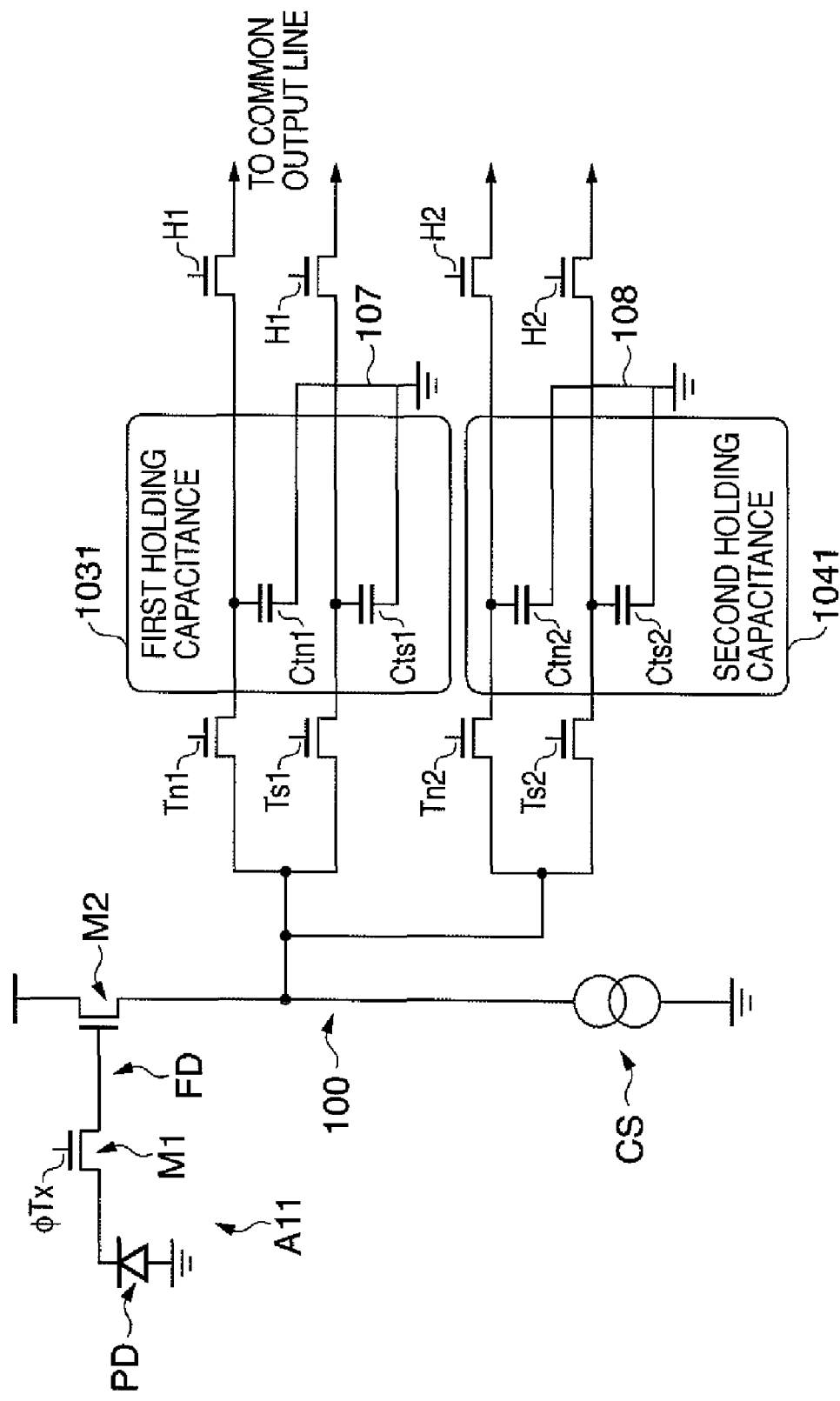
FIG. 3 is a circuit diagram showing a simple arrangement in FIG. 2.

An example of the circuit arrangement of the image sensing device 1 according to the first embodiment of the present invention will be explained with reference to FIGS. 2 and 3. FIG. 2 is a circuit diagram showing an example of the circuit arrangement of the image sensing device 1 according to the first embodiment of the present invention. FIG. 3 is a circuit diagram showing a simple arrangement in FIG. 2.

In FIG. 2, holding capacitances of each column in the plurality of first holding capacitances 103 are indicated as first holding capacitances 1031. The first holding capacitance 1031 includes a capacitance Ctn1 and Cts1. The capacitance Ctn1 holds a reference signal component (noise-level N signal) output from the first pixel (e.g., the pixel A11). The capacitance Cts1 holds a pixel signal component (optical signal-level S signal) output from the first pixel. The capacitances Ctn1 and Cts1 are arranged in the first region R1. The reference power supply electrodes of the capacitances Ctn1 and Cts1 are connected to the first reference power supply pattern 107.

Upon receiving an active-level control pulse φTn1, a switching element Tn1 is turned on to connect the column signal line 100 to the capacitance Ctn1. The capacitance Ctn1 accumulates an N signal transferred from the first pixel via the column signal line 100. Upon receiving a nonactive-level control pulse φTn1, the switching element Tn1 is turned off to disconnect the column signal line 100 from the capacitance Ctn1. The capacitance Ctn1 holds an N signal.

Upon receiving an active-level control pulse φTs1, a switching element Ts1 is turned on to connect the column signal line 100 to the capacitance Cts1. The capacitance Cts1 accumulates an S signal transferred from the first pixel via the column signal line 100. Upon receiving a nonactive-level control pulse φTs1, the switching element Ts1 is turned off to disconnect the column signal line 100 from the capacitance Cts1. The capacitance Cts1 holds an S signal.

In FIG. 2, holding capacitances of each column in the second holding capacitances 104 are indicated as second holding capacitances 1041. The second holding capacitance 1041 includes a capacitance Ctn2 and Cts2. The capacitance Ctn2 holds a reference signal component (noise-level N signal) output from the second pixel (e.g., the pixel B11). The capacitance Cts2 holds a pixel signal component (optical signal-level S signal) output from the second pixel. The capacitances Ctn2 and Cts2 are arranged in the second region R2. The reference power supply electrodes of the capacitances Ctn2 and Cts2 are connected to the second reference power supply pattern 108.

Upon receiving an active-level control pulse φTn2, a switching element Tn2 is turned on to connect the column signal line 100 to the capacitance Ctn2. The capacitance Ctn2 accumulates an N signal transferred from the second pixel via the column signal line 100. Upon receiving a nonactive-level control pulse φTn2, the switching element Tn2 is turned off to disconnect the column signal line 100 from the capacitance Ctn2. The capacitance Ctn2 holds an N signal.

Upon receiving an active-level control pulse φTs2, a switching element Ts2 is turned on to connect the column signal line 100 to the capacitance Cts2. The capacitance Cts2 accumulates an S signal transferred from the second pixel via the column signal line 100. Upon receiving a nonactive-level control pulse φTs2, the switching element Ts2 is turned off to disconnect the column signal line 100 from the capacitance Cts2. The capacitance Cts2 holds an S signal.

A switching element H1 is turned on in the first period in which the horizontal scanning circuit 106 selects a certain column (e.g., a column of the pixels A11 to B21) and a control signal φS1 active. In response to this, the N signal of the first pixel held in the capacitance Ctn1 and the S signal of the first pixel held in the capacitance Cts1 are read out to the common output lines 105, and supplied to a differential amplifier 201.

The differential amplifier 201 calculates the difference between the N and S signals of the first pixel (performs CDS processing), and thereby outputs an image signal of the first pixel free from the noise component.

A switching element H2 is turned on in the second period in which the horizontal scanning circuit 106 selects the certain column and a control signal φS2 is active. In response to this, the N signal of the second pixel held in the capacitance Ctn2 and the S signal of the second pixel held in the capacitance Cts2 are read out to the common output lines 105, and supplied to the differential amplifier 201.

The differential amplifier 201 calculates the difference between the N and S signals of the second pixel (performs CDS processing), and thereby outputs an image signal of the second pixel free from the noise component.

Figure 4:
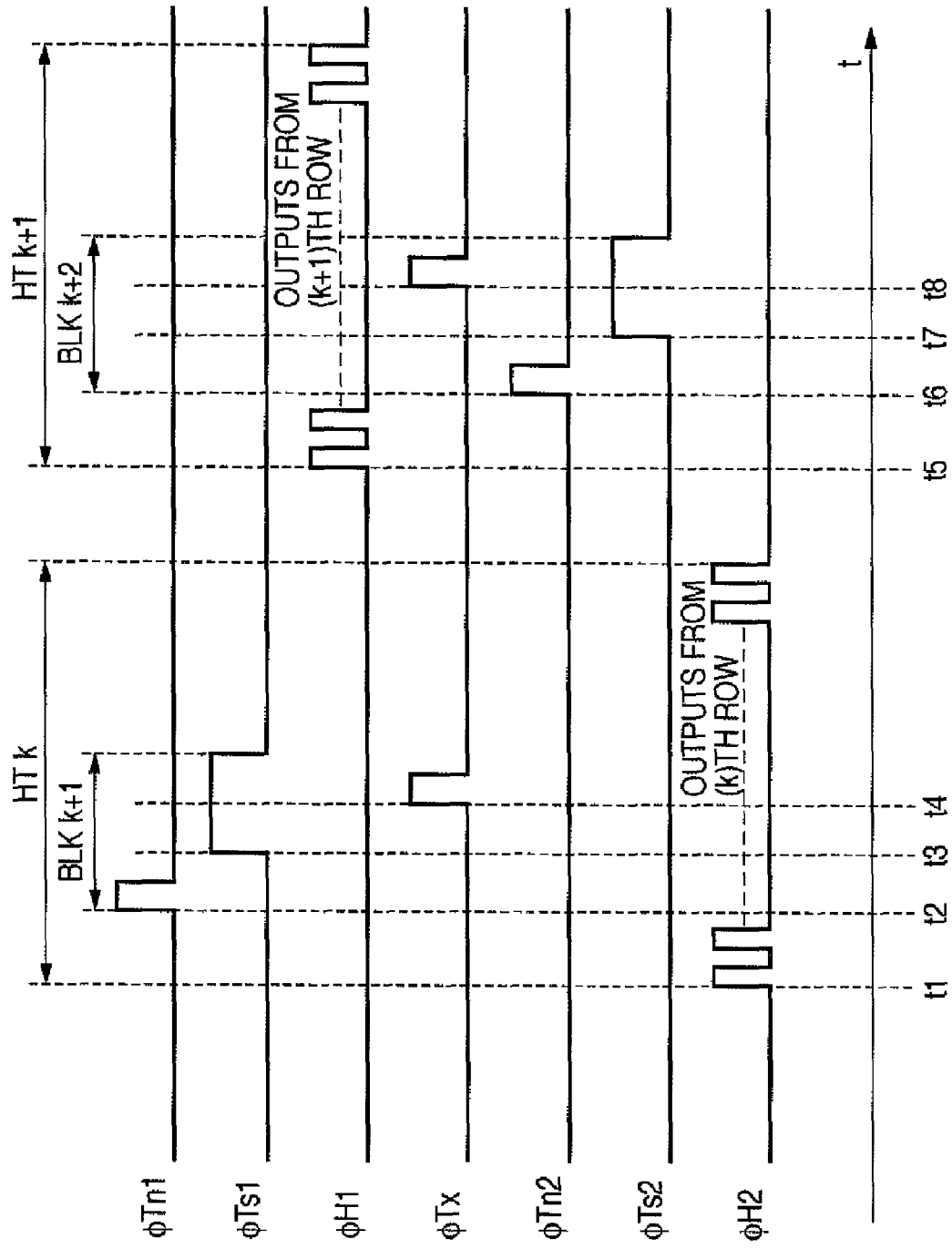
FIG. 4 is a timing chart showing the operation of the image sensing device 1 according to the first embodiment of the present invention.

The operation of the image sensing device 1 according to the first embodiment of the present invention will be explained with reference to FIG. 4. FIG. 4 is a timing chart showing the operation of the image sensing device 1 according to the first embodiment of the present invention. A control signal φTx shown in FIG. 4 is supplied from the vertical scanning circuit 102 to the transfer unit M1 (see FIG. 3) of each pixel of the pixel array PA. Control signals φH1 and φH2 are supplied from the horizontal scanning circuit 106 via the switching elements S1 and S2 to the switching elements H1 and H2, respectively. The remaining control signals are supplied from the vertical scanning circuit 102, the horizontal scanning circuit 106, or a timing generator 98 (see FIG. 11).

In a horizontal transferring period HTk for the (k)th row that starts at timing t1, the control signals φH2 of respective columns sequentially changes to an active level to sequentially turn on the switching elements H2 of the respective columns. In response to this, the N and S signals of pixels in the (k)th row are read out from the capacitances Ctn2 and Cts2 of the respective columns to the common output lines 105.

At timing t2 in the horizontal transferring period HTk, the control signal φTn1 changes to an active level to turn on the switching elements Tn1 and transfer the N signals of pixels in the (k+1)th row to the capacitances Ctn1.

At timing t3 in the horizontal transferring period HTk, the control signal φTs1 changes to an active level to turn on the switching elements Ts1.

At timing t4 in the horizontal transferring period HTk, the control signal φTx changes to an active level to turn on the transfer units (transfer MOS transistors) M1 of pixels in the (k+1)th row and transfer the S signals of the pixels in the (k+1)th row to the capacitances Cts1.

In this way, the operation to read out the signals of pixels in the (k)th row to the common output lines and the operation to transfer the signals of pixels in the (k+1)th row to the holding capacitances are parallel-executed in the horizontal transferring period HTk. The horizontal transferring period HTk for the signals of pixels in the (k)th row and a horizontal blanking period (BLK period) BLKk+1 for the signals of pixels in the (k+1)th row overlap each other. In the horizontal blanking period, the vertical scanning circuit 102 is driven.

In a horizontal transferring period HTk+1 which starts at timing t5, the control signals φH1 of respective columns sequentially changes to an active level to sequentially turn on the switching elements H1 of the respective columns. In response to this, the N and S signals of pixels in the (k+1)th row are read out from the capacitances Ctn1 and Cts1 of the respective columns to the common output lines 105.

At timing t6 in the horizontal transferring period HTk+1, the control signal φTn2 changes to an active level to turn on the switching elements Tn2 and transfer the N signals of pixels in the (k+2)th row to the capacitances Ctn2.

At timing t7 in the horizontal transferring period HTk+1, the control signal φTs2 changes to an active level to turn on the switching elements Ts2.

At timing t8 in the horizontal transferring period HTk+1, the control signal φTx changes to an active level to turn on the transfer units (transfer MOS transistors) M1 of pixels in the (k+2)th row and transfer the S signals of the pixels in the (k+2)th to the capacitances Cts2.

In this manner, the operation to read out the signals of pixels in the (k+1)th row to the common output lines and the operation to transfer the signals of pixels in the (k+2)th row to the holding capacitances are parallel-executed in the horizontal transferring period HTk+1. The horizontal transferring period HTk+1 for the signals of pixels in the (k+1)th row and the horizontal blanking period BLKk+2 for the signals of pixels in the (k+2)th row overlap each other.

Since the BLK period overlaps the horizontal transferring period of a preceding row, as described above, the readout time is shortened to increase the number of shooting frames (shooting count) per unit time. However, as described in Description of the Related Art, when the BLK period and horizontal scanning period overlap each other, noise may be superposed on an output signal. As an effect of the present invention, a mechanism for suppressing the superposition of noise will be explained.

In FIG. 3, while horizontal transfer of the switching element H1 is executed by driving of the horizontal scanning circuit 106, the switching element Tn2 is turned on to transfer, to the second holding capacitance Ctn2, the reference signal component of a predetermined pixel that is held in the charge-voltage converter FD. At this time, charges may move upon the ON operation of the switching element Tn2, generating noise. However, both the transferred signal and the signal held in the capacitance Ctn2 before transfer are reference signal components, so the potential of the signal electrode hardly fluctuates upon turning on the switching element Tn2.

Then, the switching element Ts2 is turned on, and the transfer unit (transfer MOS transistor) M1 of the predetermined pixel is subsequently turned on to transfer the pixel signal to the capacitance Cts2. At this time, when the capacitance Cts2 holds a large signal component in a preceding frame especially upon light irradiation, charges move at the timing when the switching element Ts2 is turned on. Since the reference power supply pattern has a resistance component (wiring resistance), a reference power supply potential transferred by the reference power supply pattern fluctuates upon movement of charges.

Figure 20:
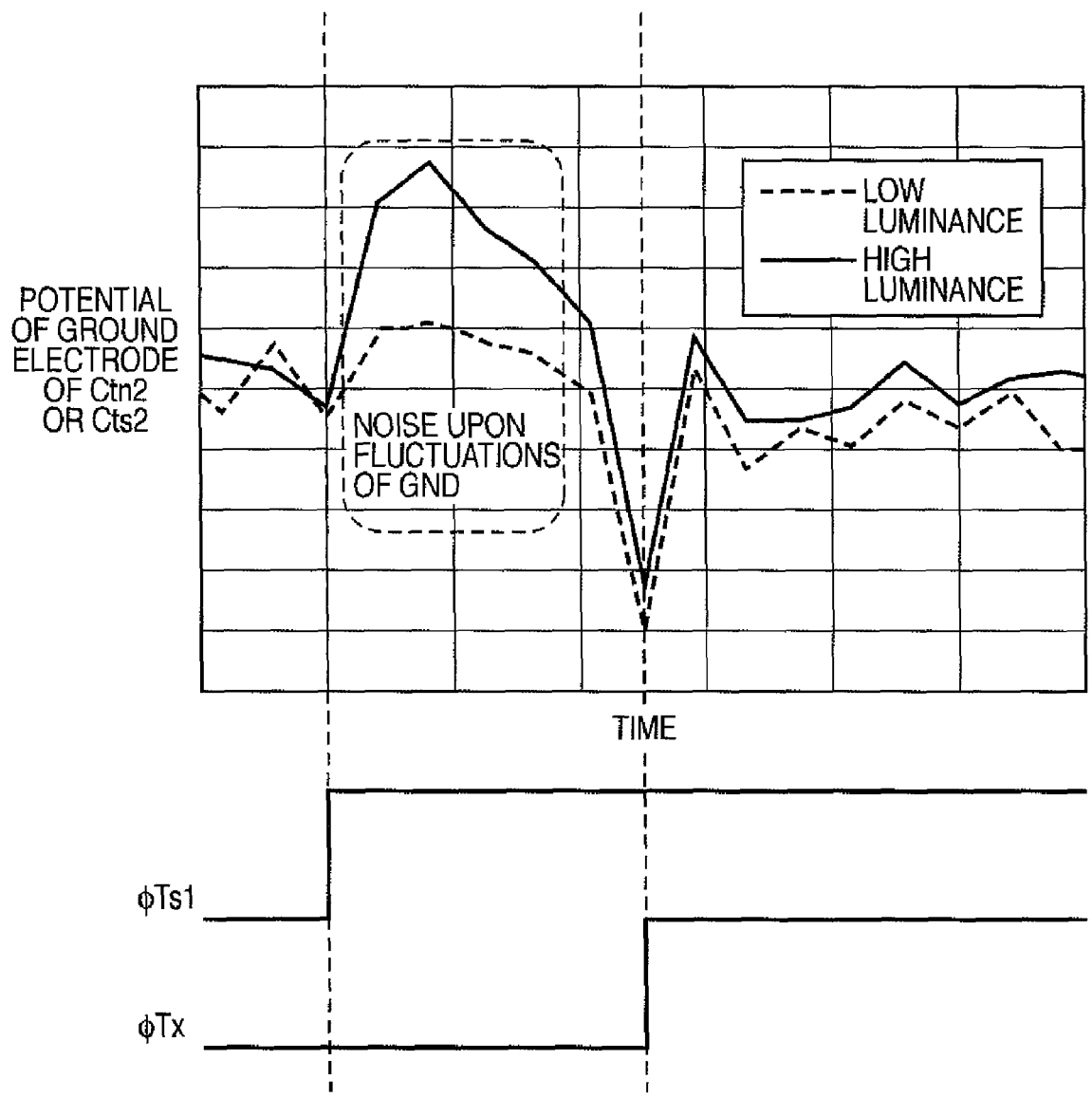
FIG. 20 is a view for explaining a problem to be solved by the present invention.
Figure 21:
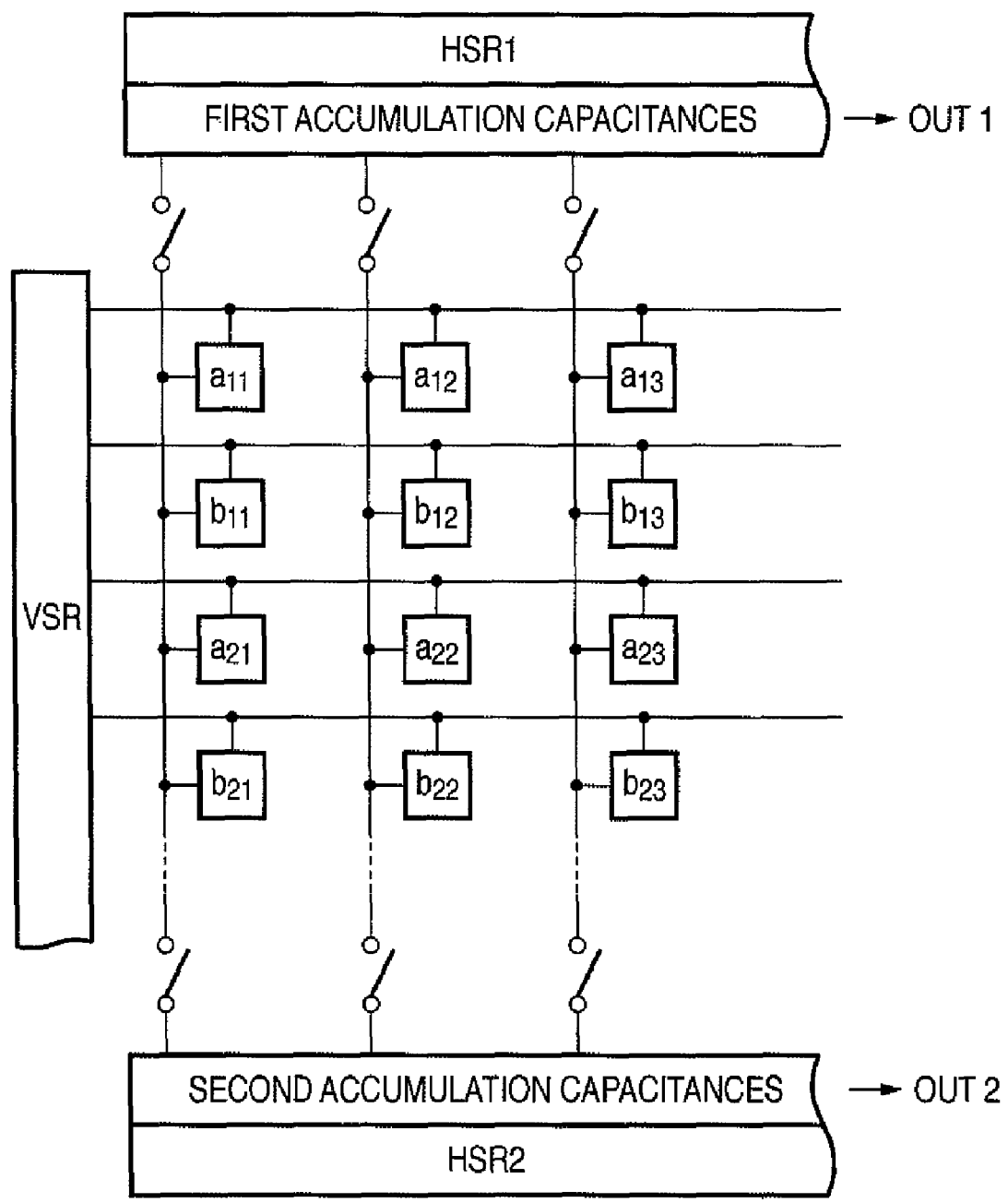
FIG. 21 is a diagram for explaining a conventional technique.

A case wherein the first holding capacitance 103 (Ctn1 and Cts1) and the second holding capacitance 104 (Ctn2 and Cts2) are connected to one reference power supply pattern and the BLK operation and horizontal scanning period temporally overlap each other will be examined. In this case, if the reference power supply potential of one holding capacitance fluctuates, that of the other holding capacitance also fluctuates. As a result, noise is superposed on a signal to be held in the other holding capacitance. Superposition of noise is shown in FIG. 20. FIG. 20 is a view showing fluctuations of the potential of the reference power supply electrode of the capacitance Ctn2 or Cts2 upon turning on the switching element Ts1 when the first and second holding capacitances are connected to one reference power supply pattern. As shown in FIG. 20, the potential of the reference power supply electrode of the second holding capacitance fluctuates at the timing when the switching element Ts is turned on. A long time is taken to stabilize a signal held in the second holding capacitance. Further, the amount of charges held in the holding capacitance is different between low- and high-luminance signals of an object, so the level of mixed noise changes. It is difficult to correct noise whose level fluctuates over a predetermined period and changes depending on the luminance.

It seems that such noise can be reduced by increasing the width of one reference power supply pattern to decrease its wiring resistance. However, a large area is required to decrease the resistance of one reference power supply pattern. It is difficult to adopt this measure in a recent situation in which a demand has arisen more and more for reducing areas where pixels and holding capacitances are formed.

To the contrary, according to the first embodiment, the reference power supply electrodes of the first holding capacitance 1031 (Ctn1 and Cts1) and second holding capacitance 1041 (Ctn2 and Cts2) are connected to the first reference power supply pattern 107 and second reference power supply pattern 108, respectively. The reference power supply electrodes of the first holding capacitance 1031 (Ctn1 and Cts1) and second holding capacitance 1041 (Ctn2 and Cts2) are electrically isolated from each other in the region CR (see FIG. 1) including the first region R1 and second region R2. Hence, even if the potential of the reference power supply electrode of Cts2 fluctuates, the potentials of the reference power supply electrodes of Ctn1 and Cts1 hardly fluctuate (for example, the amplitude of noise is about 1/10 of that shown in FIG. 20). As a result, even when the BLK period and horizontal scanning period temporally overlap each other, superposition of noise upon fluctuations of the reference power supply potential can be suppressed.

Figure 5:
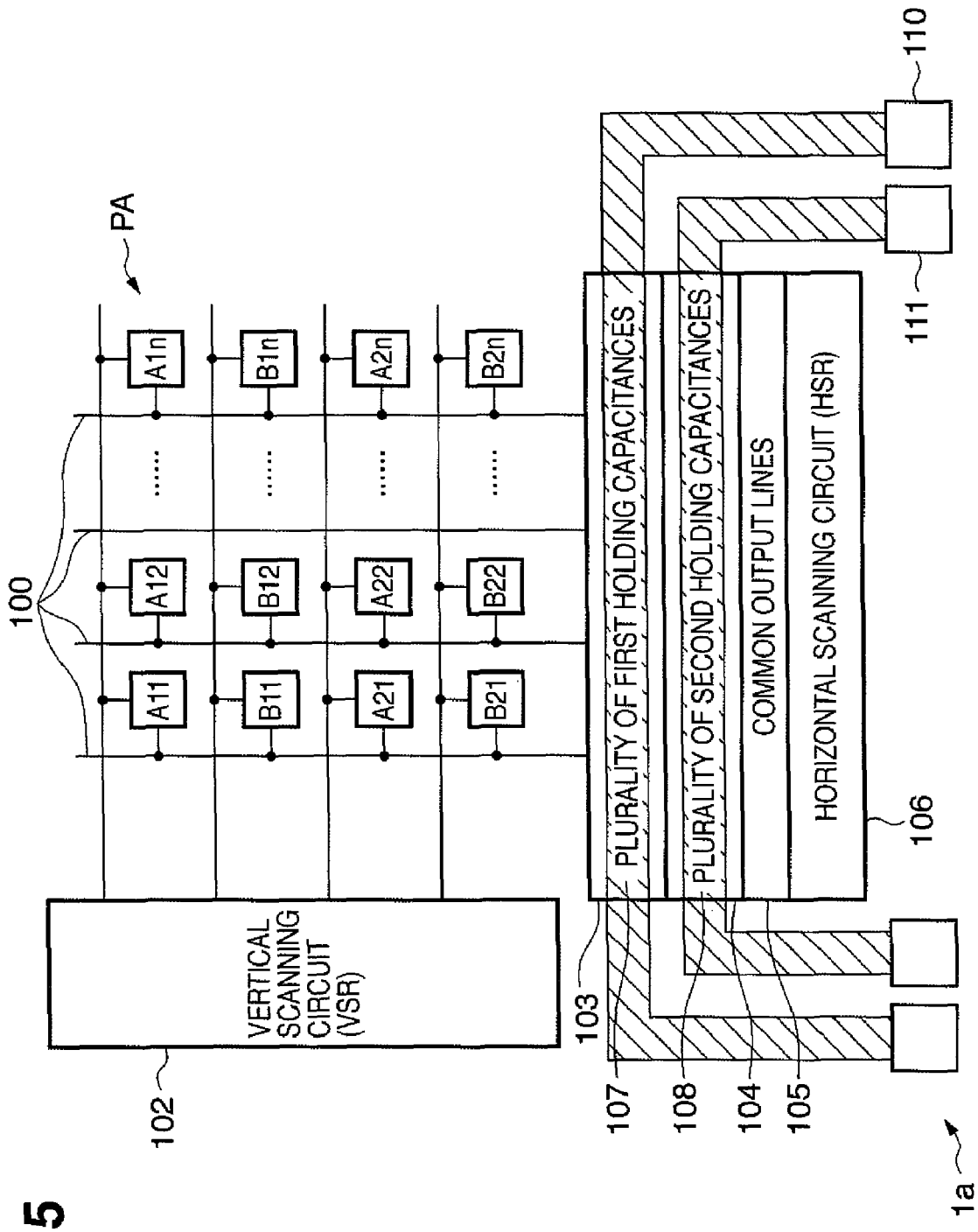
FIG. 5 is a diagram showing the schematic arrangement of an image sensing device 1a according to a modification to the first embodiment of the present invention.

As disclosed in the first embodiment, while minimizing an increase in area, noise can be greatly reduced by electrically isolating the reference power supply electrodes of holding capacitances in an region where the holding capacitances are arranged. It is relatively easy to increase the width of the reference power supply pattern and the influence on the reference power supply electrode of the reference power supply pattern is limited outside an region where pixels are arrayed and outside an region where holding capacitances are arranged. In this region, the reference power supply patterns of the first and second holding capacitances need not always be isolated. In the first embodiment, as shown in FIG. 1, the first reference power supply pattern 107 of the first holding capacitance 103 and the second reference power supply pattern 108 of the second holding capacitance 104 are electrically isolated in the region CR including the first region R1 and second region R2. Since a large-area wiring pattern can be formed outside the region CR, the first reference power supply pattern 107 and second reference power supply pattern 108 are connected to the wide common reference power supply pattern 120, preventing an increase in the number of pads. If an increase in the number of pads is permitted, an image sensing device 1*a* may also be configured as shown in FIG. 5. More specifically, the first reference power supply pattern 107 and second reference power supply pattern 108 are electrically isolated till pads by connecting them to first reference power supply pads 110 and second reference power supply pads 111, respectively.

A reference power supply voltage applied from the reference power supply pattern to the reference power supply electrode of a holding capacitance Ct may be a ground voltage or another fixed voltage serving as a reference.

The circuit arrangement is not limited to one in the first embodiment as long as the first and second holding capacitances are arranged and the BLK operation can be executed during the horizontal transferring period.

For example, amplifiers may be arranged between the pixels in respective columns and the first holding capacitances. In this case, an N signal of each column may include an offset of the amplifier. The amplifier performs a clamp operation to generate a difference signal between the above-described noise-level signal and the above-described optical signal-level signal. An S signal of each column may include the difference signal in addition to the offset.

Figure 6:
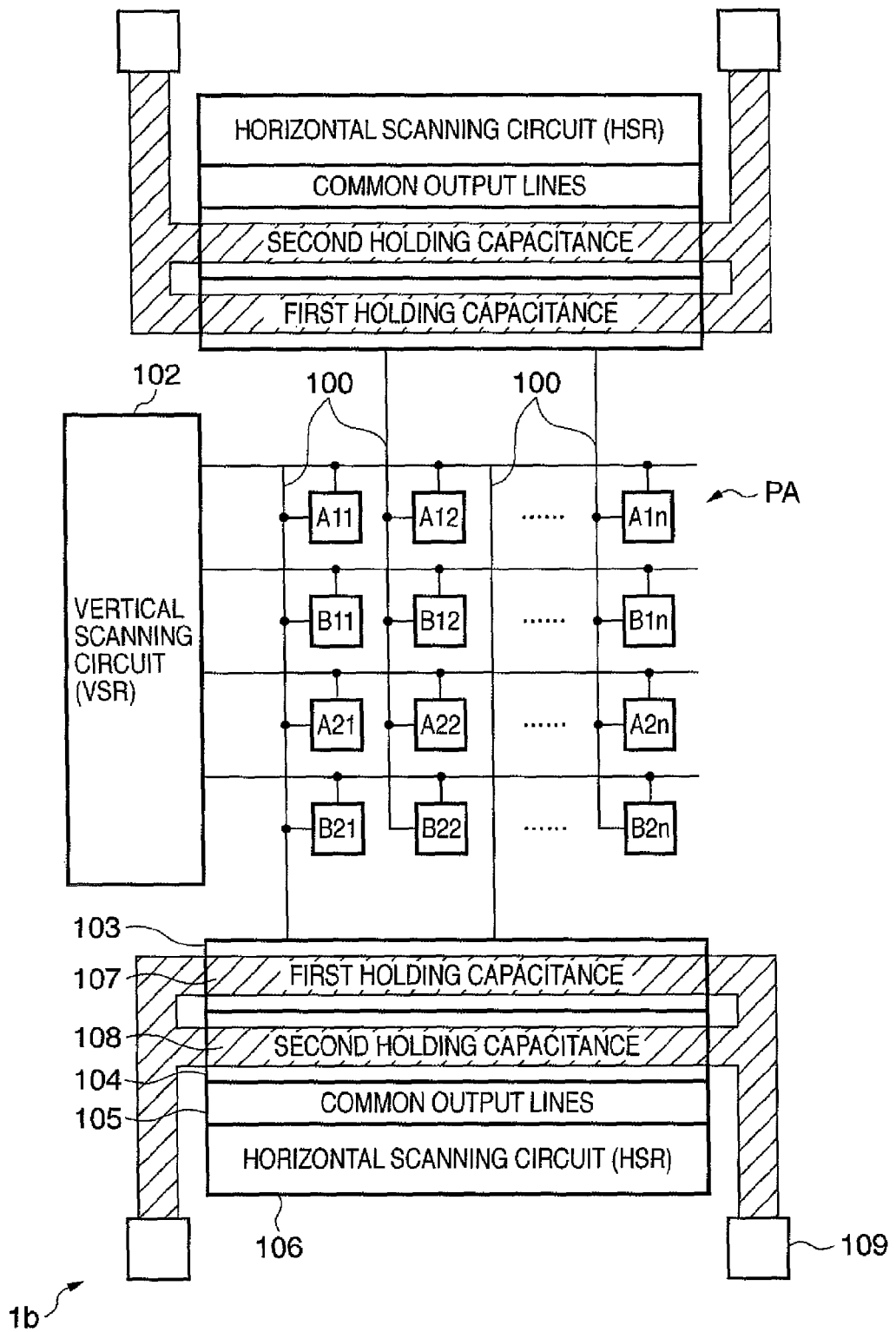
FIG. 6 is a diagram showing the schematic arrangement of an image sensing device 1b according to another modification to the first embodiment of the present invention.

In the first embodiment, the first and second holding capacitances are arranged on only one side of the pixel array PA, but an image sensing device 1*b* may also be configured as shown in FIG. 6. More specifically, the first and second holding capacitances, common output lines, and a horizontal scanning circuit may be arranged on the other side of the pixel array PA as well. In this case, pixel signals can be read out to the upper or lower part for each column, further increasing the readout speed (further shortening the total readout period).

Figure 7:
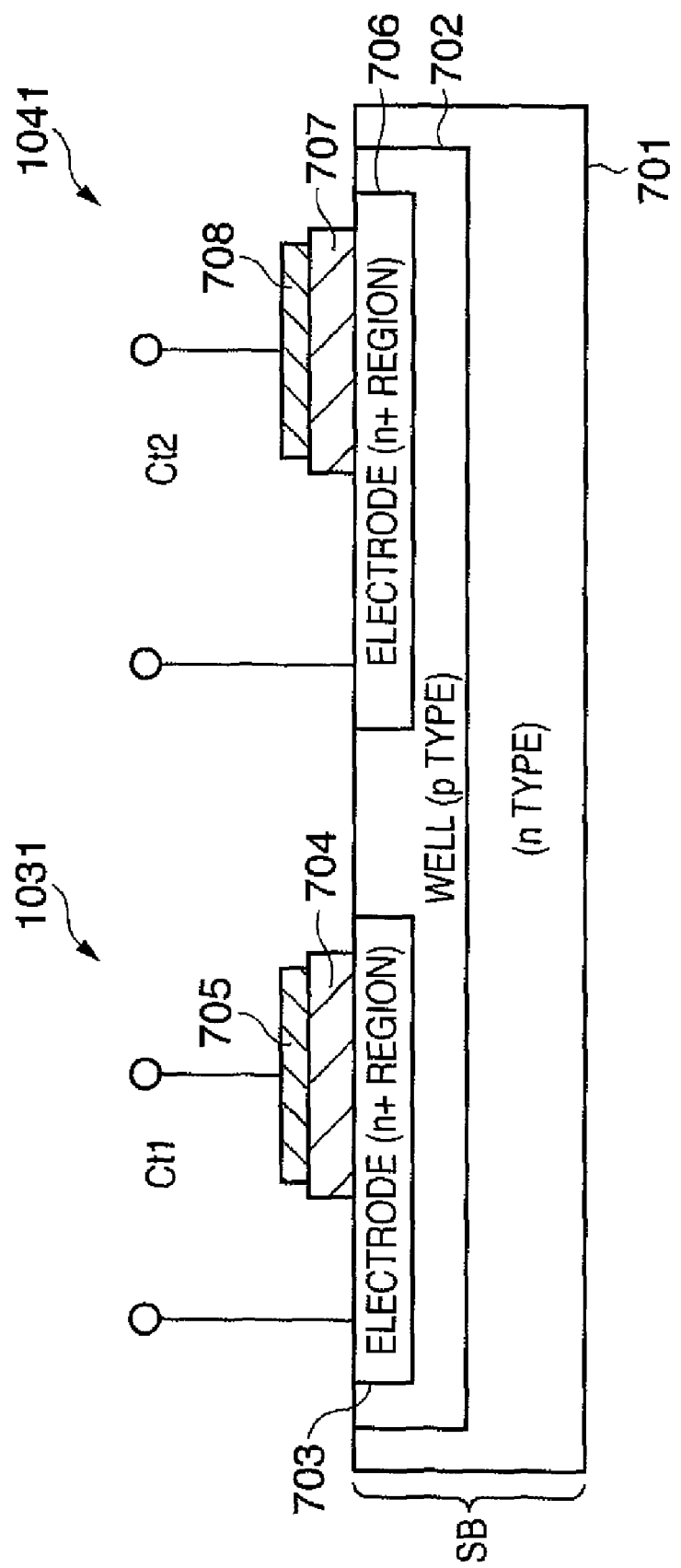
FIG. 7 is a sectional view showing an example of the sectional structure of the first and second holding capacitances (modification)

An example of the sectional structure of the first and second holding capacitances will be explained with reference to FIG. 7. FIG. 7 is a sectional view showing an example of the sectional structure of the first and second holding capacitances.

In an n-type (first conductivity type) semiconductor region 701 in a semiconductor substrate SB, a well 702 of the p type (second conductivity type) opposite to the n type (first conductivity type) is formed. In the well 702 (in the well), a first n-type semiconductor region 703 as the reference power supply electrode of the first holding capacitance 1031 is formed. A polysilicon layer 705 is deposited on an oxide film 704 on the first semiconductor region 703. A first holding capacitance 1031 is formed using the polysilicon layer 705 as a signal electrode and the first semiconductor region 703 as a reference power supply electrode. In the first embodiment, the potential of the p-type well 702 formed in the n-type semiconductor region 701 (in the semiconductor region) is the reference power supply potential. The first semiconductor region 703 formed in the well 702 is connected to the reference power supply potential via the reference power supply pattern. A signal is written in the top polysilicon layer 705.

In the well 702, a second n-type semiconductor region 706 serving as the reference power supply electrode of the second holding capacitance 1041 is formed. A polysilicon layer 708 is deposited on an oxide film 707 on the second semiconductor region 706. The polysilicon layer 708 functions as the signal electrode of the second holding capacitance 1041, and the second semiconductor region 706 functions as the reference power supply electrode of the second holding capacitance 1041. In the first embodiment, the potential of the p-type well 702 formed in the n-type semiconductor region 701 is the reference power supply potential. The second semiconductor region 706 formed in the well 702 is connected to the reference power supply potential via the reference power supply pattern. A signal is written in the polysilicon layer 708.

The second semiconductor region 706 is electrically isolated from the first semiconductor region 703 in the well 702. This structure prevents fluctuations of the potential of the reference power supply electrode of the first holding capacitance from transferring to the reference power supply electrode of the second holding capacitance. Alternatively, this structure prevents fluctuations of the potential of the reference power supply electrode of the second holding capacitance from transferring to the reference power supply electrode of the first holding capacitance.

Figure 8:
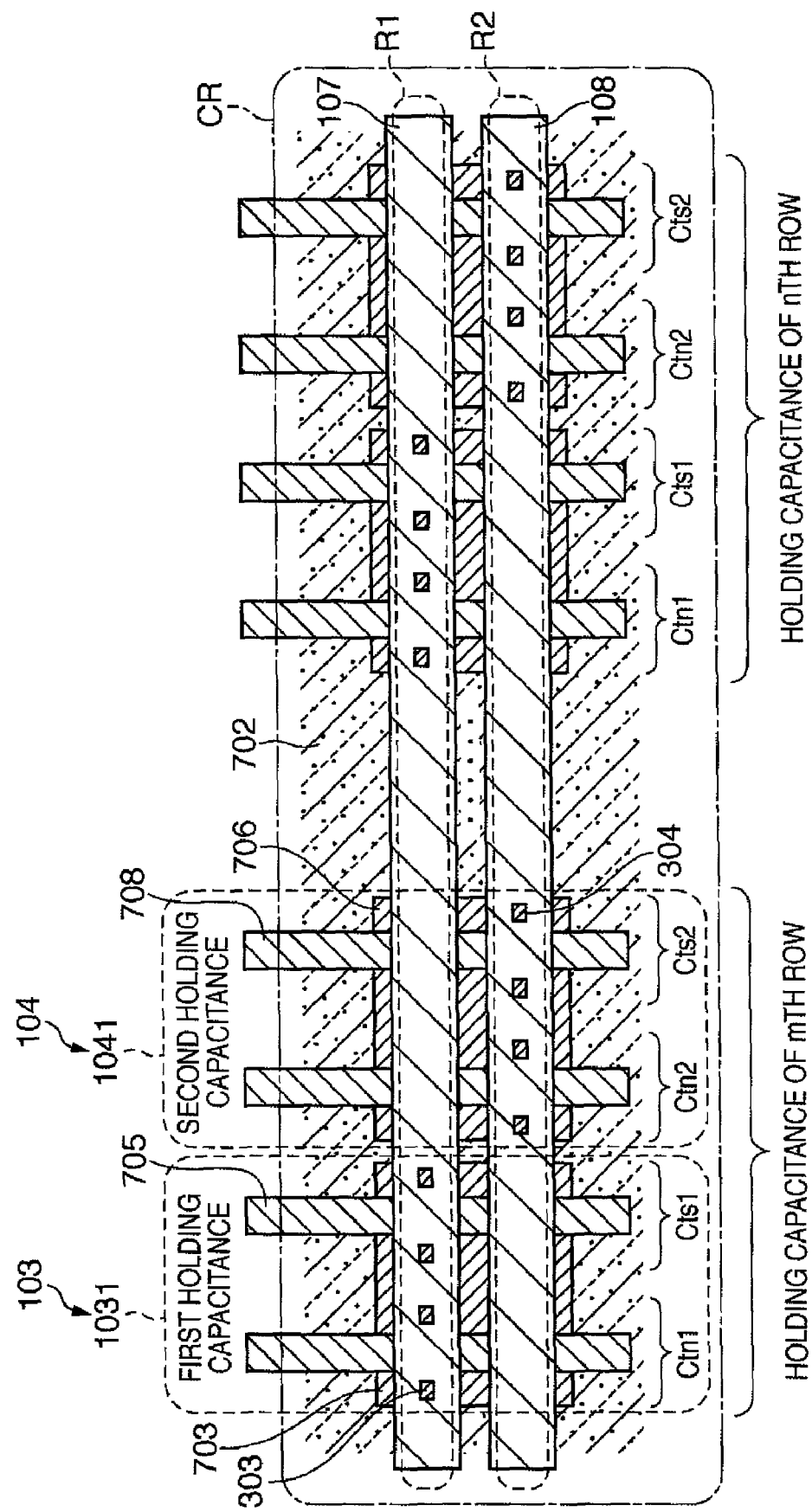
FIG. 8 is a plan view showing an example of the layout of the first and second holding capacitances (modification)

An example of the layout of the first and second holding capacitances will be explained with reference to FIG. 8. FIG. 8 is a plan view showing an example of the layout of the first and second holding capacitances.

The polysilicon layer 705, and the first semiconductor region 703 in the well 702 form the first holding capacitance 1031. The polysilicon layer 708, and the second semiconductor region 706 in the well 702 form the second holding capacitance 1041. Pairs each of the first holding capacitance 1031 and second holding capacitance 1041, which are arranged in the horizontal direction (row direction), are repetitively arrayed in the horizontal direction (row direction). More specifically, the first holding capacitances 103 and second holding capacitances 104 are arranged to be aligned alternately in the row direction in the region CR including the first region R1 and second region R2. Each of the first holding capacitances 103, and the first reference power supply pattern 107 are electrically connected via a contact 303 in the first region R1. Each of the second holding capacitances 104, and the second reference power supply pattern 108 are electrically connected via a contact 304 in the second region R2. The layout shown in FIG. 8 can easily implement a circuit arrangement (see FIG. 2) in which the first and second holding capacitances are configured to receive signals of pixels in parallel between the column signal lines and the common output lines.

The layout shown in FIG. 8 may also be used to implement a circuit arrangement (see FIG. 15) in which the first and second holding capacitances are configured to receive a signal of a pixel in series between the column signal lines and the common output lines.

Figure 9:
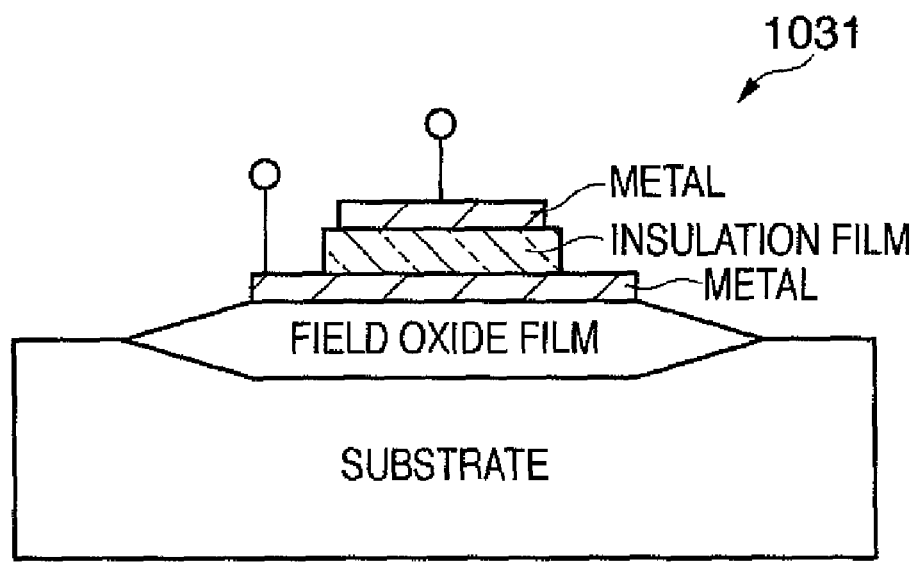
FIG. 9 is a sectional view showing a holding capacitance (modification)
Figure 10:
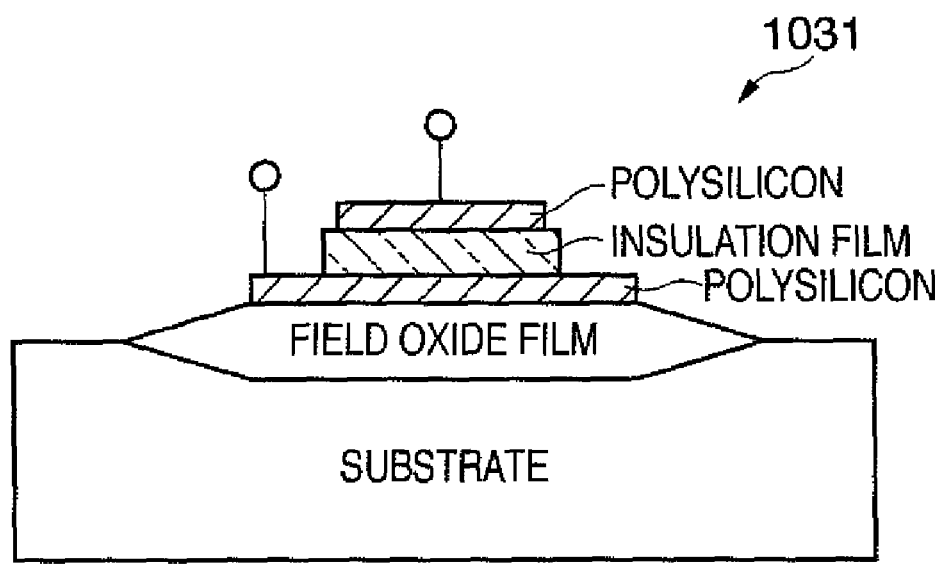
FIG. 10 is a sectional view showing a holding capacitance (modification)

The holding capacitance may not always have a MOS capacitor structure. The holding capacitance may also have a "metal/insulation film/metal" structure shown in FIG. 9 or a "polysilicon/insulation film/polysilicon" structure shown in FIG. 10 as long as at least the reference power supply electrodes of the first and second holding capacitances are electrically isolated from each other.

Figure 11:
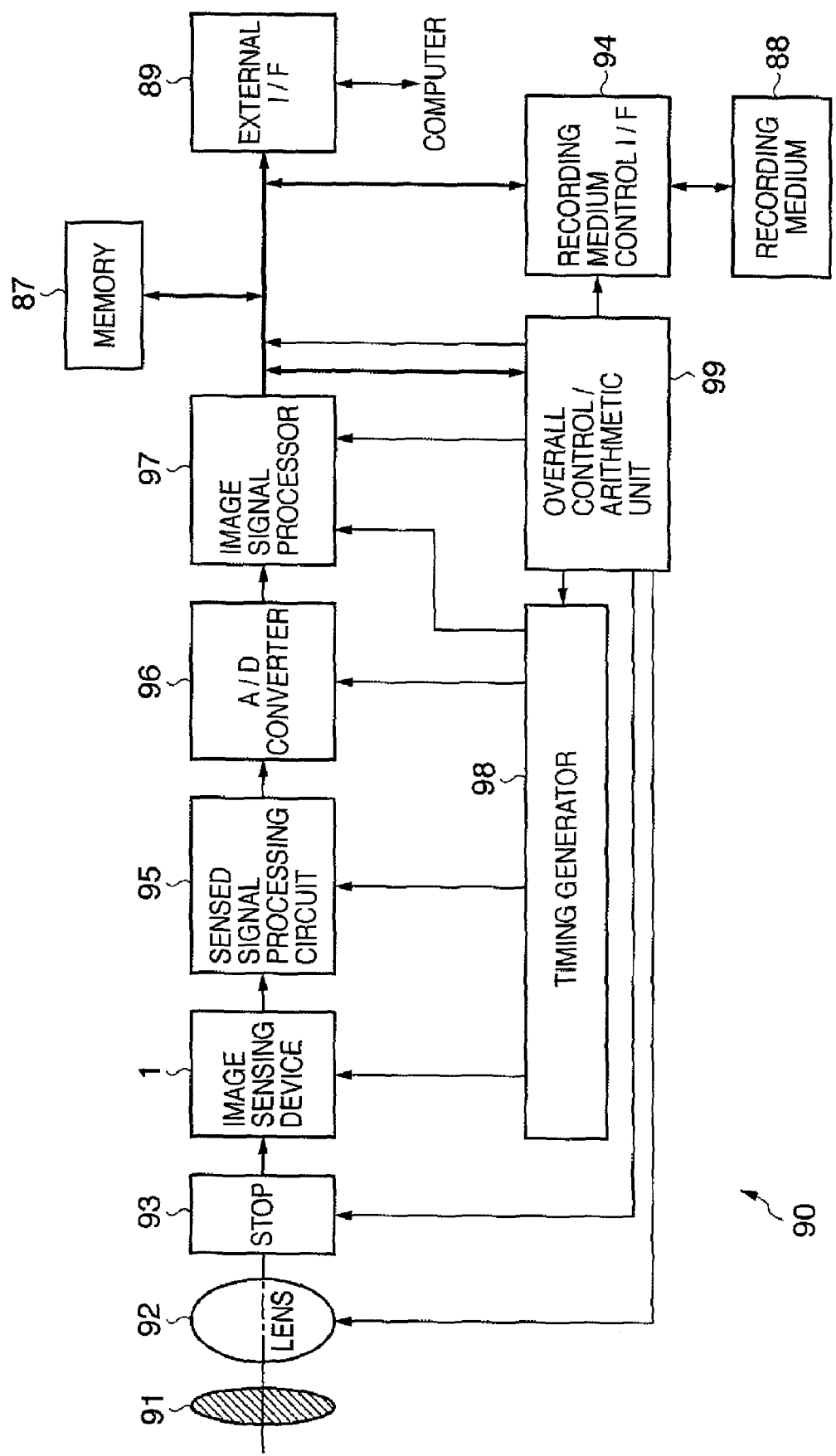
FIG. 11 is a block diagram showing the configuration of an imaging system to which the image sensing device according to the first embodiment is applied.

FIG. 11 shows an example of an imaging system to which the image sensing device according to the present invention is applied.

As shown in FIG. 11, an imaging system 90 mainly includes an optical system, the image sensing device 1, and a signal processing unit. The optical system mainly includes a shutter 91, lens 92, and stop 93. The signal processing unit mainly includes a sensed signal processing circuit 95, an A/D converter 96, an image signal processor 97, a memory 87, an external I/F 89, the timing generator 98, an overall control/arithmetic unit 99, a recording medium 88, and a recording medium control I/F 94. The signal processing unit may not include the recording medium 88.

The shutter 91 is arranged in front of the lens 92 on the optical path to control the exposure.

The lens 92 refracts incident light to form an object image on the pixel array (image sensing surface) of the image sensing device 1.

The stop 93 is interposed between the lens 92 and the image sensing device 1 on the optical path. The stop 93 adjusts the quantity of light guided to the image sensing device 1 after passing through the lens 92.

The image sensing device 1 converts an object image formed on the pixel array into an image signal. The image sensing device 1 reads out the image signal from the pixel array, and outputs it.

The sensed signal processing circuit 95 is connected to the image sensing device 1, and processes an image signal output from the image sensing device 1.

The A/D converter 96 is connected to the sensed signal processing circuit 95. The A/D converter 96 converts a processed image signal (analog signal) output from the sensed signal processing circuit 95 into an image signal (digital signal).

The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like.

The memory 87 is connected to the image signal processor 97, and stores image data output from the image signal processor 97.

The external I/F 89 is connected to the image signal processor 97. Image data output from the image signal processor 97 is transferred to an external device (e.g., a personal computer) via the external I/F 89.

The timing generator 98 is connected to the image sensing device 1, sensed signal processing circuit 95, A/D converter 96, and image signal processor 97. The timing generator 98 supplies timing signals to the image sensing device 1, sensed signal processing circuit 95, A/D converter 96, and image signal processor 97. The image sensing device 1, sensed signal processing circuit 95, A/D converter 96, and image signal processor 97 operate in synchronism with the timing signals.

The overall control/arithmetic unit 99 is connected to the timing generator 98, image signal processor 97, and recording medium control I/F 94, and controls all of them.

The recording medium 88 is detachably connected to the recording medium control I/F 94. Image data output from the image signal processor 97 is recorded on the recording medium 88 via the recording medium control I/F 94.

With this arrangement, the image sensing device 1 can provide a high-quality image (image data) as long as it can obtain a high-quality image signal.

Figure 12:
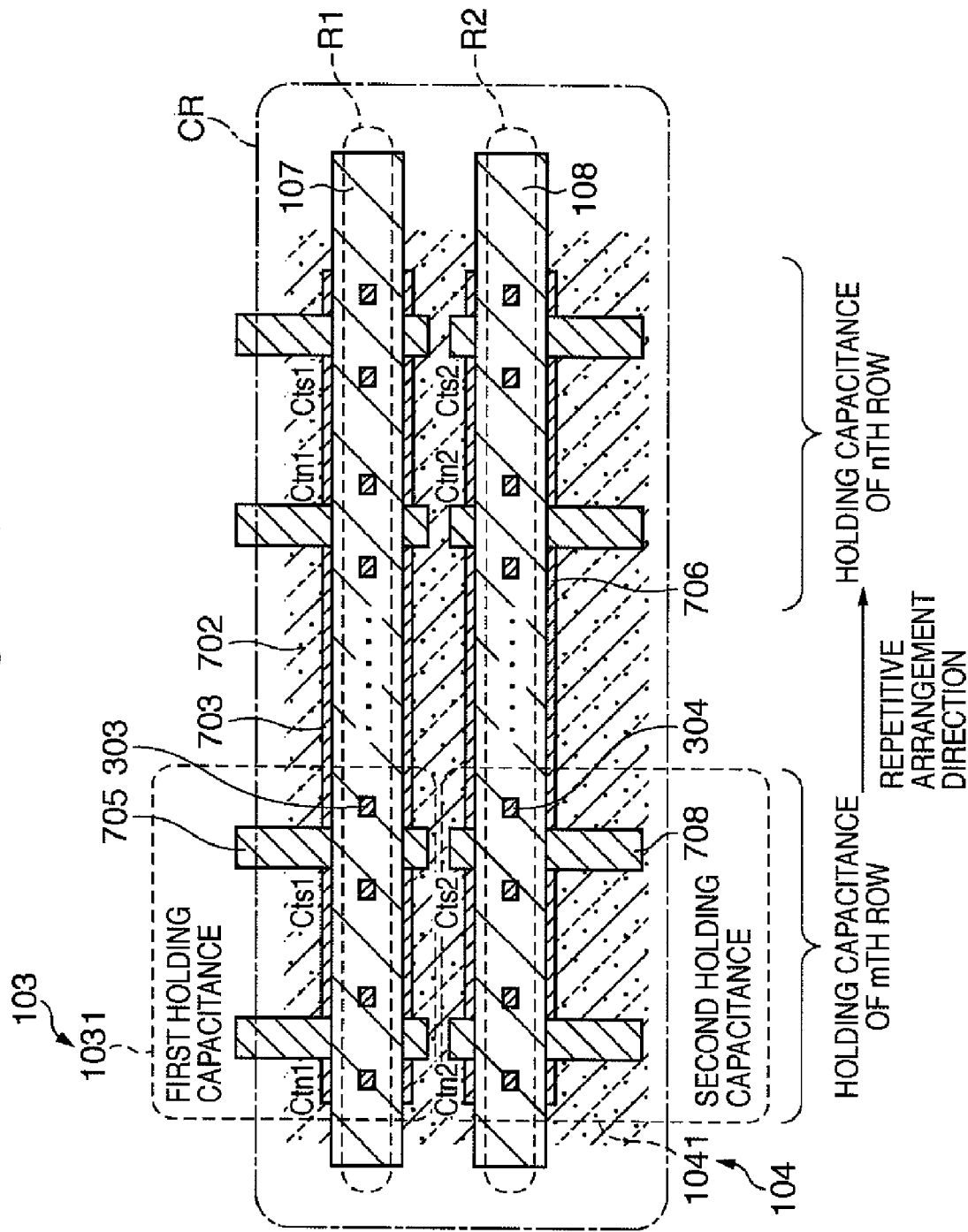
FIG. 12 is a plan view showing an example of the layout of an image sensing device according to the second embodiment of the present invention.

An image sensing device according to the second embodiment of the present invention will be explained with reference to FIG. 12. FIG. 12 is a plan view showing an example of the layout of the image sensing device according to the second embodiment of the present invention.

The arrangement of the image sensing device according to the second embodiment is different from the first embodiment in the following point. Pairs each formed by arranging a first holding capacitance 1031 and second holding capacitance 1041 in the vertical direction (column direction) are repetitively arrayed in the horizontal direction (row direction). More specifically, a plurality of first holding capacitances 103 and a plurality of second holding capacitances 104 are arranged to be aligned in the column direction in an region CR including a first region R1 and second region R2. The layout shown in FIG. 12 can easily implement a circuit arrangement (see FIG. 15) in which the first and second holding capacitances are configured to receive a signal of a pixel in series between the column signal lines and common output lines.

The layout shown in FIG. 12 may also be used to implement a circuit arrangement (see FIG. 2) in which the first and second holding capacitances are configured to receive signals of pixels in parallel between the column signal lines and common output lines.

Figure 13:
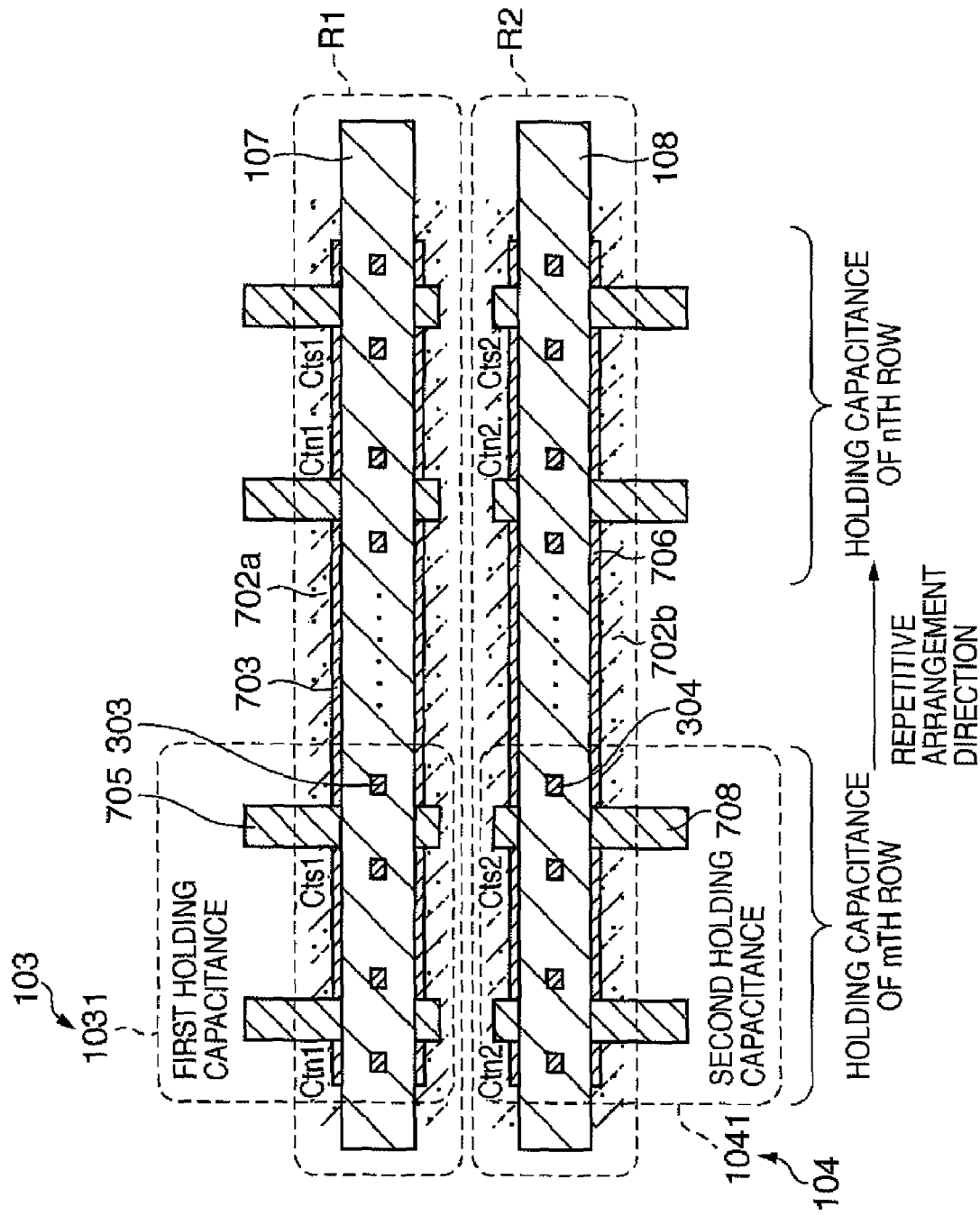
FIG. 13 is a plan view showing an example of the layout of a holding capacitance (modification)

In the image sensing device, as shown in FIG. 13, a first well 702a and second well 702b may also be formed instead of the well 702. The first well 702a is a p-type region arranged in a n-type semiconductor region 701 in the first region R1. The second well 702b is a p-type region arranged in the n-type semiconductor region 701 in the second region R2 to be isolated from the first well 702a, because the n-type semiconductor region 701 exists between the first p-type well 702a and the second p-type well 702b. A first semiconductor region 703 serving as the reference power supply electrode of the first holding capacitance 1031 is arranged in the first well 702a. A second semiconductor region 706 serving as the reference power supply electrode of the second holding capacitance 1041 is arranged in the second well 702b. This structure prevents fluctuations of the potential of the reference power supply electrode of the first holding capacitance

1031 from transferring to the reference power supply electrode of the second holding capacitance 1041. Alternatively, this structure prevents fluctuations of the potential of the reference power supply electrode of the second holding capacitance 1031 from transferring to the reference power supply electrode of the first holding capacitance 1041.

Figure 14:
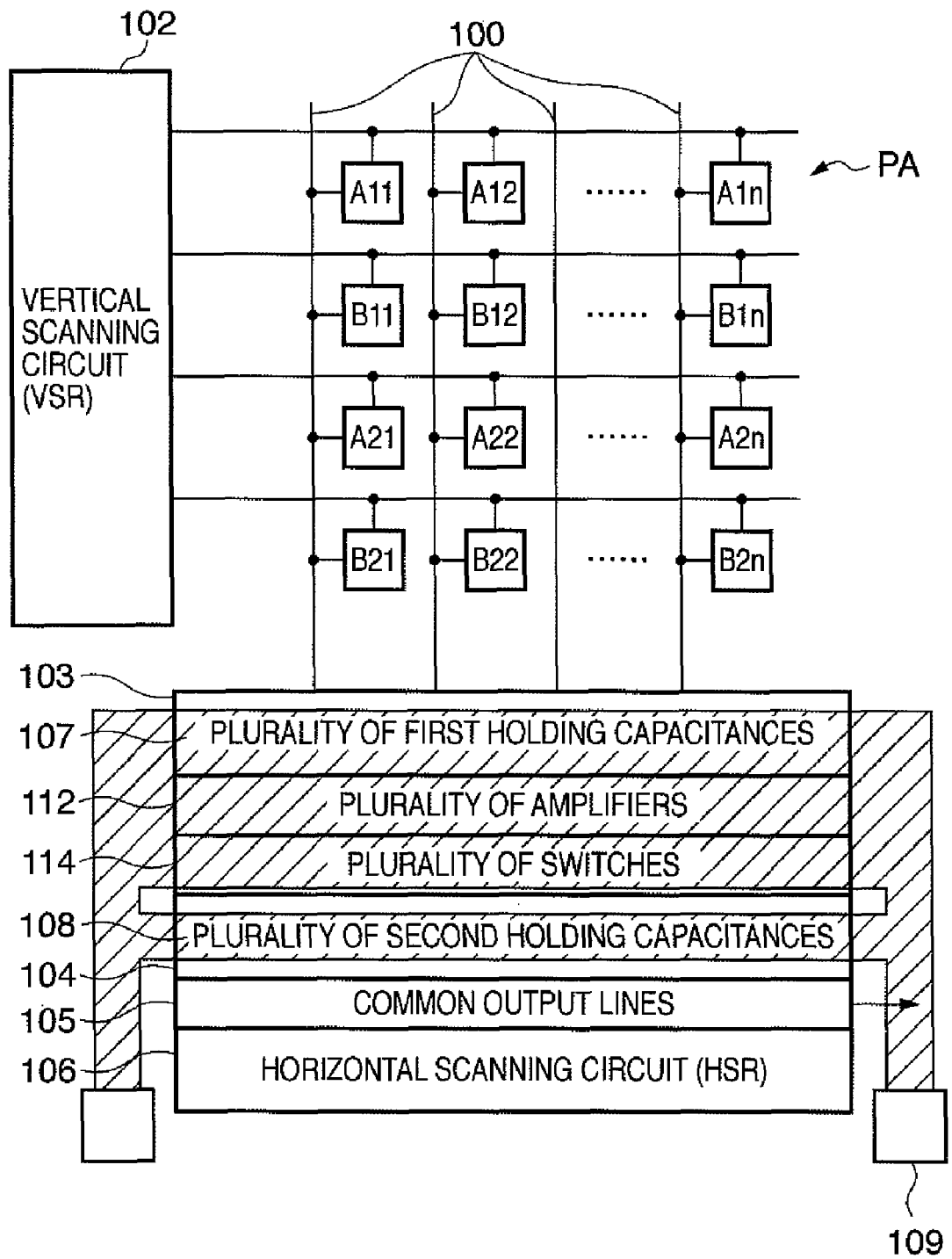
FIG. 14 is a diagram showing the arrangement of an image sensing device according to the third embodiment of the present invention.
Figure 15:
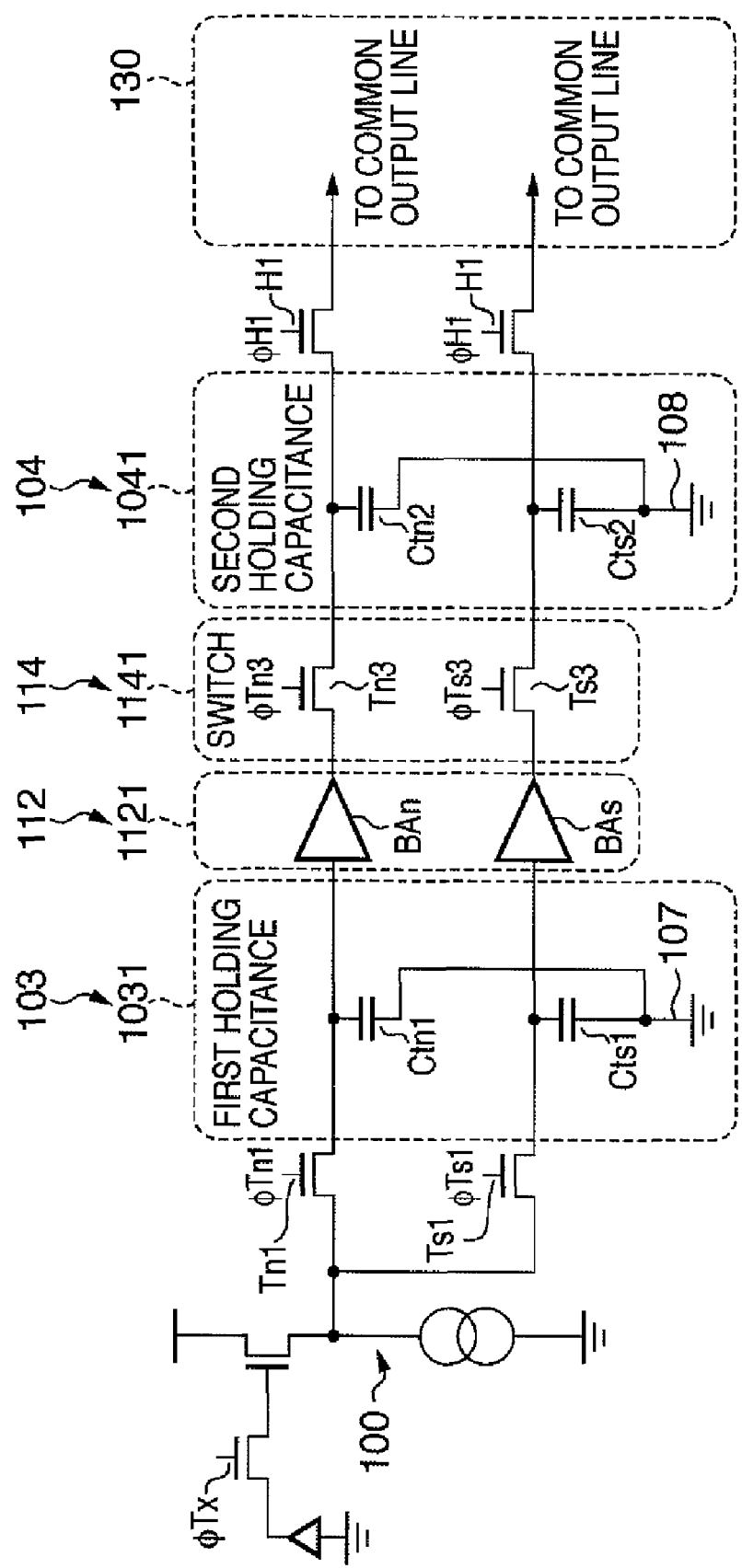
FIG. 15 is a circuit diagram showing an example of the circuit arrangement of the image sensing device according to the third embodiment of the present invention.

An image sensing device according to the third embodiment of the present invention will be explained with reference to FIGS. 14 and 15. FIG. 14 is a diagram showing the arrangement of the image sensing device according to the third embodiment of the present invention. FIG. 15 is a circuit diagram showing an example of the circuit arrangement of the image sensing device according to the third embodiment of the present invention.

The arrangement of the image sensing device according to the third embodiment is different from the first embodiment in the following point. The first holding capacitances 1031 and second holding capacitances 1041 are configured to receive a signal of a pixel in series between a column signal line 100 and common output lines 105. Amplifiers 1121 and switches 1141 are interposed between the first holding capacitances 1031 and the second holding capacitances 1041. The amplifiers 1121 include, for example, buffer amplifiers BAn and BAs. The switches 1141 include, for example, switching elements Tn3 and Ts3. In FIG. 15, amplifiers of each column in a plurality of amplifiers (a plurality of first amplifiers) 112 are indicated as the amplifiers 1121, and switches of each column in a plurality of switches 114 are indicated as the switches 1141.

In other words, the plurality of amplifiers 112 is interposed between a plurality of first holding capacitances 103 and a plurality of second holding capacitances 104. The plurality of amplifiers 112 correspond to the plurality of first holding capacitances 103 and also correspond to the plurality of second holding capacitances 104. Signals held in the first holding capacitances 103 are output to the corresponding amplifiers 112. The amplifiers 112 amplify signals held in the corresponding first holding capacitances 103. The second holding capacitances 104 hold, as other signals, signals amplified by the corresponding amplifiers 112. Then, the other signals held in the second holding capacitances 104 are read out to common output lines 105.

An output unit 130 outputs a signal transferred via the common output lines 105. Because the amplifier 1121 interposed between the first and second holding capacitances can amplify a signal, the capacitance value of each first holding capacitance 103 may be smaller than that of each second holding capacitance 104. This enable the layout area of the first and second holding capacitances to be reduced.

Other signals held in the second holding capacitances are read out to the output unit 130 by capacitive division based on the capacitance value of the second holding capacitance 1041 and that of the common output line 105. At this time, the capacitance value of each second holding capacitance 104 is larger than that of each first holding capacitance 103, so other signals can be read out to the common output lines without decreasing the gain. The capacitance values can be compared based on the electrode area as long as holding capacitances have, for example, the similar structure (structure having the same electrode interval, insulation film dielectric constant, and the like).

Figure 16:
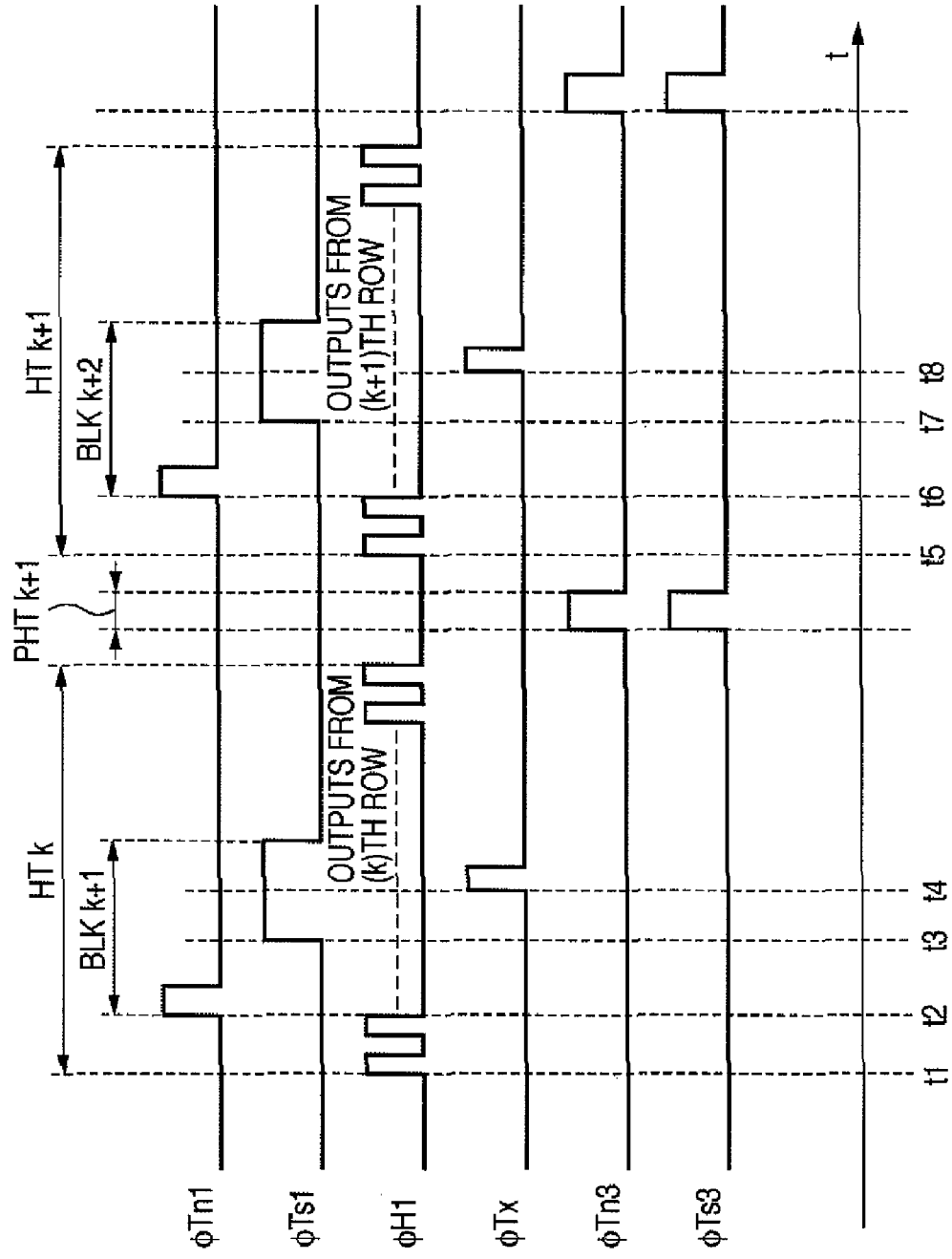
FIG. 16 is a timing chart showing the operation of the image sensing device according to the third embodiment of the present invention.

The operation of the image sensing device according to the second embodiment is different from the first embodiment in the following point as shown in FIG. 16.

In a horizontal transferring period HTk for the (k)th row that starts at timing t1, control signals φH1 of respective columns sequentially change to an active level to sequentially turn on switching elements H1 of the respective columns.

In a preliminary horizontal transferring period PHTk+1 for the (k+1)th row between the horizontal transferring period HTk for the (k)th row and a horizontal transferring period HTk+1 for the (k+1)th row, control signals φTn3 and φTs3 change to an active level to turn on the switching elements Tn3 and Ts3. In response to this, the N signals of pixels in the (k+1)th row are transferred from the capacitances Ctn1 via the buffer amplifiers BAn to the capacitances Ctn2 on respective columns, and the S signals are transferred from the capacitances Cts1 via the buffer amplifiers BAs to the capacitances Cts2 on the respective columns.

In a circuit arrangement in which the first and second holding capacitances are configured to receive a signal of a pixel in series between the column signal lines and the common output lines, the connection form between the first and second holding capacitances is not limited to that shown in FIG. 15. Instead of the buffer amplifier, a gain amplifier which apply the gain to a signal or a voltage follower, source follower, or the like may also be arranged between the first and second holding capacitances.

Figure 17:
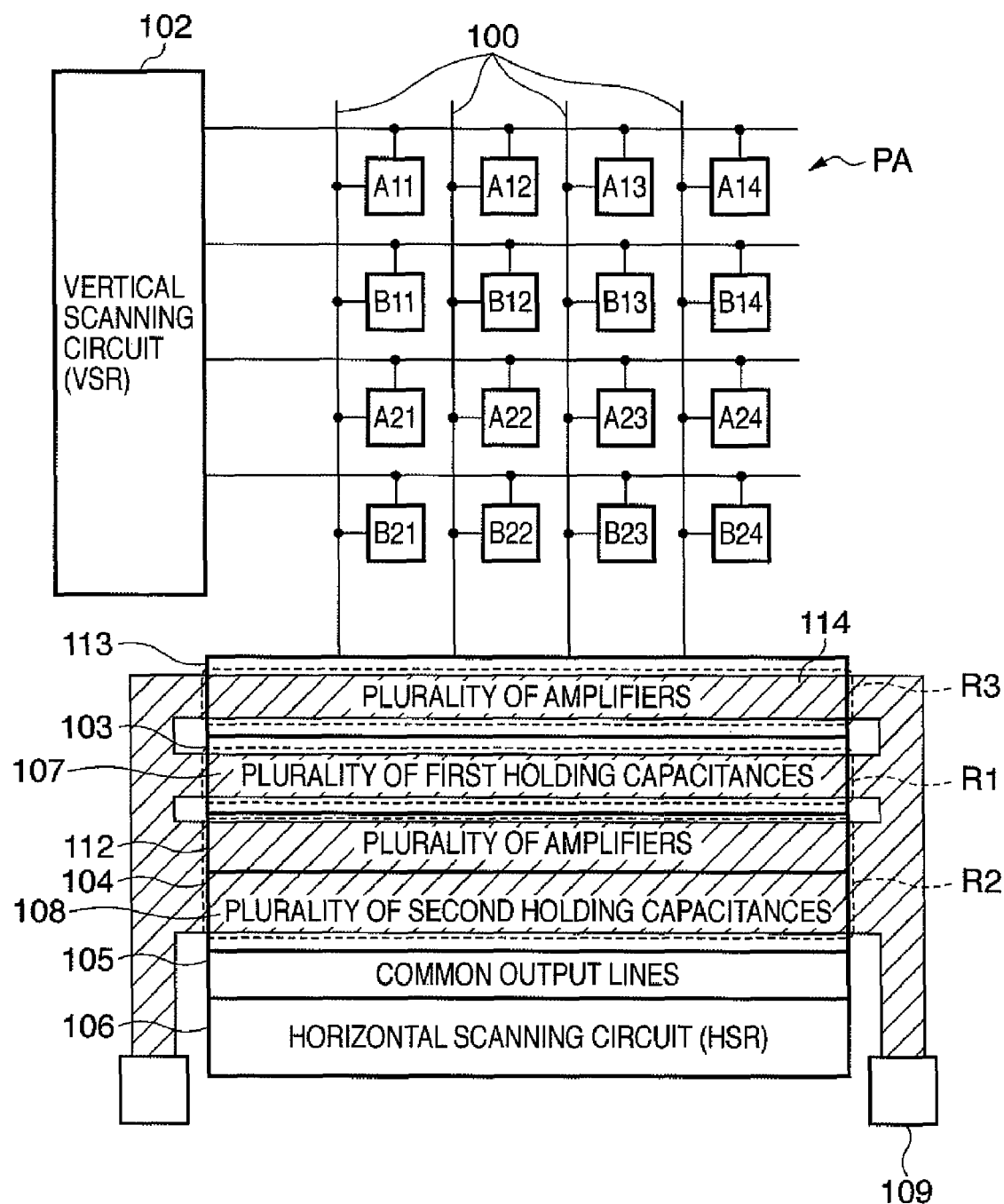
FIG. 17 is a diagram showing the arrangement of an image sensing device according to the fourth embodiment of the present invention.
Figure 18:
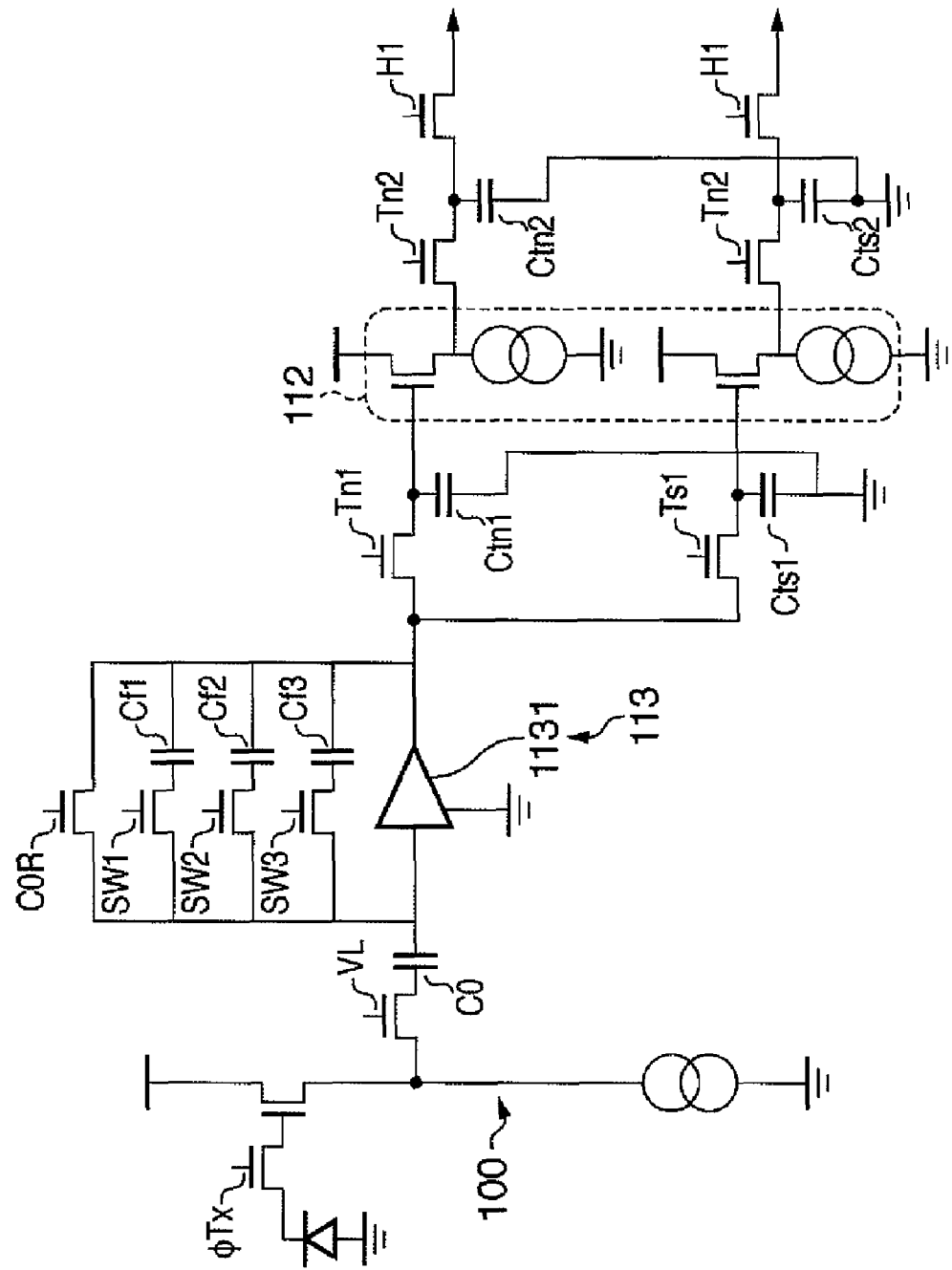
FIG. 18 is a circuit diagram showing an example of the circuit arrangement of the image sensing device according to the fourth embodiment of the present invention.

An image sensing device according to the fourth embodiment of the present invention will be explained with reference to FIGS. 17 and 18. FIG. 17 is a diagram showing the arrangement of the image sensing device according to the fourth embodiment of the present invention. FIG. 18 is a circuit diagram showing an example of the circuit arrangement of the image sensing device according to the fourth embodiment of the present invention.

The arrangement of the image sensing device according to the fourth embodiment is different from the first embodiment in the following point. A plurality of amplifiers (a plurality of second amplifiers) 113 is interposed between column signal lines 100 and first holding capacitances 103. A switch VL is interposed between each column signal line 100 and each amplifier 1131 to connect or disconnect the column signal line 100 and a capacitance C0. A switch C0R for the clamping operation, and a plural sets of switches SW1 to SW3 & capacitances Cf1 to Cf3 are parallel-connected between the input and output terminals of the amplifier 1131. The switch C0R turns on/off to connect/disconnect the feed back path of the amplifier and thereby performs the clamping operation. The switches SW1 to SW3 turns on/off to activate/deactivate the corresponding capacitance Cf1 to Cf3 and thereby change a value of feed back capacitances of the amplifier.

With this structure, the amplifier 1131 can apply a gain at a ratio of C0/(sum of selected ones of Cf1 to Cf3). Cf1 to Cf3 are selected by turning on the switches SW1 to SW3 series-connected to them. That is, the gain of the amplifier 1131 can be changed by changing the feedback capacitance of the amplifier 1131.

Each of the plurality of amplifiers 112 and a second reference power supply pattern 108 are electrically connected in a second region R2, as shown in FIG. 17.

Each of the amplifiers 113 and a third reference power supply pattern 114 are electrically connected in a third region R3. The third region R3 is defined between a pixel array PA and a first region R1.

Figure 19:
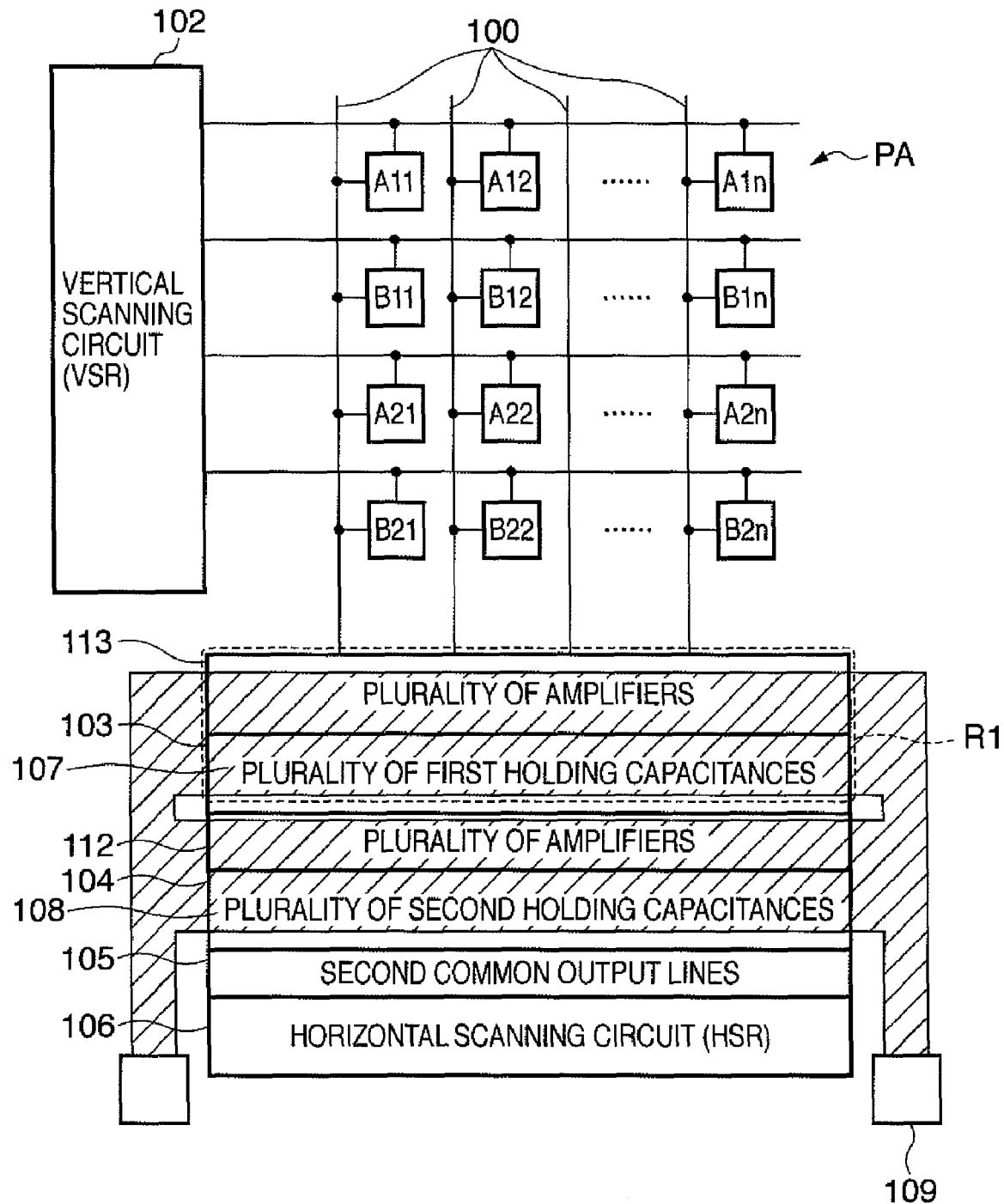
FIG. 19 is a diagram showing the arrangement of an image sensing device according to a modification to the fourth embodiment of the present invention.

As shown in FIG. 19, each of the amplifiers 113 and a first reference power supply pattern 107 may also be electrically connected in the first region R1.

It should be noted that an N signal of each column may include the above-described noise-level signal and an offset of the amplifier 1131 and that an S signal of each column may include the above-described optical signal-level signal and the offset.

Alternatively, it should be noted that an N signal of each column may include an offset of the amplifier 1131. The amplifier performs a clamp operation to generate a difference signal between the above-described noise-level signal and the above-described optical signal-level signal. An S signal of each column may include the difference signal in addition to the offset.

While the present invention has been described with reference to exemplary embodiments, it is to be understood that the invention is not limited to the disclosed exemplary embodiments. The above-described embodiments can be combined each other. The scope of the following claims is to be accorded the broadest interpretation so as to encompass all such modifications and equivalent structures and functions.

This application claims the benefit of Japanese Patent Application No. 2008-066736, filed Mar. 14, 2008 which is hereby incorporated by reference herein in its entirety.

The invention claimed is:

1. An image sensing device characterized by comprising:
    a pixel array in which a plurality of pixels are two-dimensionally arrayed and output signals to a plurality of signal lines;
    a plurality of first holding capacitances which hold a first signals transferred via the plurality of signal lines;
    a plurality of second holding capacitances which hold a second signals transferred at different timing from the first signals via the plurality of signal lines;
    a first reference power supply pattern for the plurality of first holding capacitances; and
    a second reference power supply pattern for the plurality of second holding capacitances,
    wherein at least part of the first reference power supply pattern is arranged in a first region where reference power supply electrodes of the plurality of first holding capacitances are arrayed,
    at least part of the second reference power supply pattern is arranged in a second region where reference power supply electrodes of the plurality of second holding capacitances are arrayed, and
    the first reference power supply pattern and the second reference power supply pattern are isolated at least between the first region and the second region in a region including the first region and the second region.

2. The device according to claim 1, characterized in that the respective reference power supply electrodes of the plurality of first holding capacitances and the first reference power supply pattern are electrically connected in the first region, and
    the respective reference power supply electrodes of the plurality of second holding capacitances and the second reference power supply pattern are electrically connected in the second region.

3. The device according to claim 1, characterized by further comprising a common reference power supply pattern which electrically connects the first reference power supply pattern and the second reference power supply pattern outside the region including the first region and the second region,
    wherein the common reference power supply pattern is electrically connected to a reference power supply pad.

4. The device according to claim 3, characterized in that a width of the common reference power supply pattern is larger than a width of the first reference power supply pattern and a width of the second reference power supply pattern.

5. The device according to claim 1, characterized in that the first reference power supply pattern is electrically connected to a first reference power supply pad, and the second reference power supply pattern is electrically connected to a second reference power supply pad.

6. The device according to claim 1, characterized in that the plurality of first holding capacitances and the plurality of second holding capacitances are arranged to be aligned alternately in a direction across the signal line.

7. The device according to claim 1, characterized in that the plurality of first holding capacitances and the plurality of second holding capacitances are arranged to be aligned in a direction along the signal line.

8. The device according to claim 1, characterized by further comprising:
    a semiconductor region of a first conductivity type; and
    a well of a second conductivity type opposite to the first conductivity type which is arranged in the semiconductor region,
    wherein each of the plurality of first holding capacitances includes
        a first electrode which receives the transferred first signal, and
        a first semiconductor region of the first conductivity type which is arranged in the well and functions as the reference power supply electrode, and
    each of the plurality of second holding capacitances includes
        a second electrode which receives the transferred second signal, and
        a second semiconductor region of the first conductivity type which is arranged in the well to be isolated from the first semiconductor region, and functions as the reference power supply electrode.

9. The device according to claim 1, characterized by further comprising:
    a semiconductor region of a first conductivity type;
    a first well of a second conductivity type opposite to the first conductivity type which is arranged in the semiconductor region; and
    a second well of the second conductivity type which is arranged in the semiconductor region to be isolated from the first well,
    wherein each of the plurality of first holding capacitances includes
        a first electrode which receives the transferred first signal, and
        a first semiconductor region of the first conductivity type which is arranged in the first well and functions as the reference power supply electrode, and
    each of the plurality of second holding capacitances includes
        a second electrode which receives the transferred second signal, and
        a second semiconductor region of the first conductivity type which is arranged in the second well and functions as the reference power supply electrode.

10. The device according to claim 1, characterized by further comprising a plurality of first amplifiers which are interposed between the plurality of first holding capacitances and the plurality of second holding capacitances, and amplify the first signals held in the plurality of first holding capacitances,
    wherein the plurality of second holding capacitances hold, as the second signals, the amplified first signals which the plurality of first amplifiers have amplified and have transferred to the plurality of second holding capacitances, and
    the second signals held in the plurality of second holding capacitances are read out to an output line.

11. The device according to claim 10, characterized by further comprising an output unit which outputs a signal transferred via the output line, wherein a capacitance value of each of the plurality of first holding capacitances is smaller than a capacitance value of each of the plurality of second holding capacitances, and the second signals held in the plurality of second holding capacitances are read out to the output unit on the basis of the capacitance value of the second holding capacitance and a capacitance value of the output line.

12. The device according to claim 10, characterized by further comprising a plurality of second amplifiers which amplify signals output to the plurality of signal lines, wherein a reference power supply pattern of each of the plurality of second amplifiers is electrically connected to the first reference power supply pattern in the first region, and a reference power supply pattern of each of the plurality of first amplifiers is electrically connected to the second reference power supply pattern in the second region.

13. The device according to claim 1, characterized in that, while the plurality of first holding capacitances hold the first signals, the second signals held in the plurality of second holding capacitances are read out to an output line.

14. An imaging system characterized by comprising:

an image sensing device defined in claim 1;

an optical system which forms an image on an image sensing surface of the image sensing device; and a signal processing unit which processes a signal output from the image sensing device to generate image data.

* * * * *